(12) United States Patent
Nii

(10) Patent No.: US 6,537,687 B1
(45) Date of Patent: Mar. 25, 2003

(54) LIGHT EMITTING ELEMENT MATERIAL

(75) Inventor: Kazumi Nii, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/540,905

(22) Filed: Mar. 31, 2000

(30) Foreign Application Priority Data

Mar. 31, 1999 (JP) .......................................... 11-094347

(51) Int. Cl.$^7$ ........................ H05B 33/14; C09K 11/06
(52) U.S. Cl. ...................... 428/690; 428/917; 313/504; 252/301.16; 564/305
(58) Field of Search ................................ 428/690, 704, 428/917; 313/504, 506; 257/40, 103; 252/301.16, 301.22, 301.34, 301.35; 564/305, 426

(56) References Cited

U.S. PATENT DOCUMENTS 5,281,489 A * 1/1994 Mori et al. ................. 428/690
6,299,796 B1 * 10/2001 Igarashi ................. 252/301.16

FOREIGN PATENT DOCUMENTS

| JP | 60-99189 | | 6/1985 |
| JP | 4-11686 | * | 1/1992 |
| JP | 7-3256 | * | 1/1995 |
| JP | 7-228865 | * | 8/1995 |
| JP | 8-97465 | | 4/1996 |

OTHER PUBLICATIONS

AN 1992:416967 Hcaplus (for JP 4–11686, Jan. 1992).*
AN 1995:408898 Hcaplus (for JP 7–3256, Jan. 1995).*
AN 1995:901888 Hcaplus (for JP 7–228865, Aug. 1995).*
Effect of majority carrier space charges on minority carrier injection in dye doped polymer light–emitting devices, S. Berleb et al., Apr. 15, 1998, vol. 83, No. 8, pp. 4403–4409.

* cited by examiner

Primary Examiner—Marie Yamnitzky
(74) Attorney, Agent, or Firm—Sughrue Mion, PLLC

(57) ABSTRACT

A red light emitting element material with high color purity and a light emitting element using the red light emitting element material. A light emitting element material including a compound which is expressed by following general formula (A) and a light emitting element using the compound. In the following general formula (A), at least two of $R^1$, $R^2$, and $R^3$ each independently represents an aryl group or heterocyclic group, and at least one of the $R^1$, $R^2$, and $R^3$ contains a group expressed by following general formula (B). In the general formula (B), $R^4$ represents a heterocyclic group or electron attracting group, $R^5$ represents a hydrogen atom or electron attracting group, $R^6$, $R^7$, and $R^8$ each independently represents a hydrogen atom or substituent, and m represents 0, 1, or 2. However, in a case in which only one group expressed by the general formula (B) is contained in the general formula (A), $R^4$ and $R^5$ are not cyano groups at the same time. When $R^5$ is a hydrogen atom, $R^4$ represents a heterocyclic group which has aromatic rings and is formed from 3 to 7 rings.

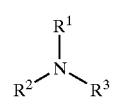

General formula (A)

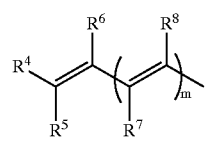

General formula (B)

7 Claims, No Drawings

LIGHT EMITTING ELEMENT MATERIAL

BACKGROUND OF THE INVENTION

1. Field of the Invention

The present invention relates to a light emitting element material, amine compound, and organic light emitting element using the light emitting element material and amine compound, which are used for a flat surface light source and display, and more specifically, to a light emitting element material, amine compound, and light emitting element using the light emitting element material and amine compound which, with application of low voltage, can emit light ranging from green to red with high luminance and high efficiency.

2. Description of the Related Art

An organic light emitting element in which an organic material is used (hereinafter, referred to upon occasion there is a case in which it is referred as "an organic EL element") is promising for applications as an inexpensive large area full-color displaying element of a solid light emitting type, and various development thereof has been carried out in recent years. Generally, an organic light emitting element is formed by a light emitting layer and a pair of opposing electrodes which nip the light emitting layer therebetween. Light emission by the organic light emitting element is a phenomenon in which, in a case in which an electronic field is applied between the pair of electrodes which nip the light emitting layer, electrons are injected from a cathode, while positive holes are injected from an anode, and these electrons and positive holes are bound once again at the light emitting layer. An energy gap generated when energy level returns from a conduction band to a valence electron band is emitted as light.

Conventional organic light emitting elements have high driving voltage and also have low light emission luminance and light emission efficiency. However, in recent years, an organic EL element formed by laminating a thin film containing an organic compound having high fluorescent quantum efficiency and emitting light with application of low voltage of 10 volts or less has been reported (*Applied Physics Letters*, vol. 51, p. 913, 1987) and has gathered attention. The method of preparing the organic EL element uses a metal chelate complex as an electron transporting layer, a fluorescent band layer as a light emitting layer, and an amine compound as a positive hole transporting layer, to obtain a light emitting element having a green light emitting characteristic with high luminance. On the other hand, in consideration of a case in which the organic EL element is used in a full color display and a light source, practically, it is required to have the organic light emitting element emit light of three primary colors or white light. As a method of having the organic light emitting element emit light of a desired color, a method in which a fluorescent dye is doped on a light emitting layer or the like to have the organic light emitting element emit light of a desired color has been reported (*Journal of Applied Physics*, vol. 65, p. 3610, 1989). This method is effective particularly for red light emission. With red light emission, it is difficult to use a single fluorescent dye as a light emitting layer due to significant density quenching. This method is useful in terms of accomplishing satisfactory color purity and high luminance. However, there is a problem with this method that, in a case in which an element on which a dye has been doped by vapor deposition is produced, a host material and a very small quantity of the fluorescent dye must be vapor-deposited together so that the operation thereof is troublesome. Further, inconsistency in performance of the manufactured organic light emitting element is liable to occur. Therefore, in view of simplification of the manufacturing process and stabilization of the performance of elements, development of a light emitting material which has a satisfactory color purity and which can be used as a light emitting layer by itself, and particularly, development of a red light emitting material which accomplishes satisfactory chromaticity and luminance even if it is used as a light emitting layer by itself, has been desired.

On the other hand, in terms of organic EL elements, an element which is laminated on the organic material by vacuum deposition achieves high luminance light emission. However, in view of simplification of manufacturing process, workability, expansion of the area and the like, it is desirable to produce the element by a coating method. However, an element which is produced by a conventional coating method is inferior to an element which is produced by a vapor deposition method in terms of light emission luminance and light emission efficiency. Light emission with high luminance and high efficiency is a significant issue. As the coating method, there is a method in which an organic low molecular compound which is a light emitting element is applied dispersedly on an organic polymer medium. However, with the light emitting element produced in such a way, there is a problem that, in a case in which the light emitting element emits light for a long period, due to aggregation of an organic low molecular compound or the like, uniform sheet light emission gradually becomes difficult.

Moreover, in recent years, for a dye for a filter, color conversion filter, dye for photographic photosensitive material, sensitizing dye, dye for pulp dyeing, laser dye, fluorescent medicament for medical diagnosis, and material for an organic light emitting element and the like, various materials which have fluorescent characteristics have been used, and demand therefor has increased. However, there is only a small variety of red fluorescent dyes which have strong fluorescent intensity and high color purity, and development of a new material has been desired.

SUMMARY OF THE INVENTION

A first object of the present invention is to provide a red light emitting element material with high color purity and a light emitting element using the red light emitting element material.

A second object of the present invention is to provide a green-to-red light emitting element material and light emitting element capable of light emission of high luminance and high efficiency with low voltage drive. The light emitting element material and light emitting element have excellent stability when used repeatedly and are capable of emitting light uniformly in a sheet form.

A third object of the present invention is to provide a light emitting element and a green-to-red light emitting element material enabling manufacture of the light emitting element, which has little deviation in performance between elements and whose performance is stabilized.

A fourth object of the present invention is to provide a light emitting element material which is capable of light emission of high luminance and high efficiency, even if the light emitting element material is produced by a coating method, and a light emitting element using such light emitting element material.

A fifth object of the present invention is to provide a compound which has fluorescence ranging from green to red, with a strong fluorescent intensity.

The aforementioned objects are accomplished by means of first through eleventh aspects described below.

A first aspect of the present invention is a light emitting element material comprising a compound expressed by following general formula (A):

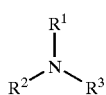

General formula (A)

wherein, in the general formula (A), $R^1$, $R^2$, and $R^3$ may be the same or different, may each have a substituent, and each independently represent an aryl group, heterocyclic group, or aliphatic hydrocarbon group; at least two of the $R^1$, $R^2$, and $R^3$ each independently represents an aryl group or heterocyclic group each of which may have a substituent; at least one of the $R^1$, $R^2$, and $R^3$ contains a group expressed by following general formula (B); and $R^1$, $R^2$, and $R^3$ may link with each other to form a ring having 5 to 7 members,

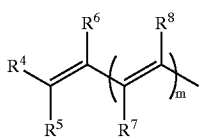

General formula (B)

wherein, in the general formula (B), $R^4$ represents a heterocyclic group or electron attracting group; $R^5$ represents a hydrogen atom or electron attracting group; $R^6$, $R^7$, and $R^8$ each independently represents a hydrogen atom or substituent; $R^6$, $R^7$, and $R^8$ may combine with each other to form a ring, or may combine with $R^1$, $R^2$, and $R^3$, respectively, to form a ring; m represents 0, 1, or 2; and when only one group expressed by the general formula (B) is contained in the general formula (A), a case where $R^4$ and $R^5$ are both cyano groups at the same time is excluded; and when $R^5$ is a hydrogen atom, $R^4$ represents a heterocyclic group which has aromatic rings and is formed from 3 to 7 rings.

A second aspect of the present invention is a light emitting element material according to the first aspect, wherein the compound expressed by the general formula (A) is a compound expressed by following general formula (I):

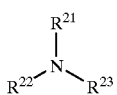

General formula (I)

wherein, in the general formula (I), $R^{21}$, $R^{22}$, and $R^{23}$ may be the same or different, may each have a substituent, and each independently represents an aryl group, heterocyclic group, or aliphatic hydrocarbon group; at least two of the $R^{21}$, $R^{22}$, and $R^{23}$ each independently represents an aryl group or heterocyclic group each of which may have a substituent; and, at least one of the $R^{21}$, $R^{22}$, and $R^{23}$ contains a group expressed by following general formula (II):

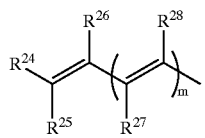

General formula (II)

wherein, in the general formula (II), $R^{24}$ represents a heterocyclic group, cyano group, perfluoroalkyl group, oxycarbonyl group, carbamoyl group, sulfonyl group, sulfamoyl group, or R(C=X)-group; $R^{25}$ represents a hydrogen atom, cyano group, perfluoroalkyl group, oxycarbonyl group, carbamoyl group, sulfonyl group, sulfamoyl group, or R(C=X)-group; R represents an aliphatic hydrocarbon group, aryl group, or heterocyclic group; X represents an oxygen atom, sulfur atom, N—$R^{A1}$, or $CR^{A2}R^{A3}$; $R^{A1}$, $R^{A2}$, and $R^{A3}$ each independently represents a hydrogen atom or substituent, excluding a case where $R^{A2}$ and $R^{A3}$ are both hydrogen atoms; $R^{26}$, $R^{27}$, and $R^{28}$ each independently represents a hydrogen atom or substituent; m represents 0, 1, or 2; and when only one group expressed by the general formula (II) is contained in the general formula (I), a case where $R^{24}$ and $R^{25}$ are cyano groups at the same time is excluded; and when $R^{25}$ is a hydrogen atom, $R^{24}$ represents a heterocyclic group which has aromatic rings and is formed from 3 to 7 rings.

A third aspect of the present invention is a light emitting element material according to the second aspect, wherein the compound expressed by the general formula (I) is a compound expressed by following general formula (III):

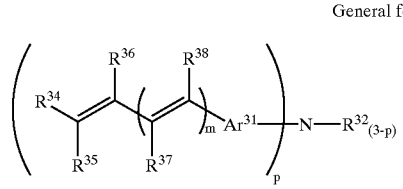

General formula (III)

wherein, in the general formula (III), $Ar^{31}$ represents a divalent aryl group or heterocyclic group; $R^{32}$ represents an aryl group, heterocyclic group, or aliphatic hydrocarbon group; $R^{34}$ represents a heterocyclic group, perfluoroalkyl group, cyano group, oxycarbonyl group, carbamoyl group, sulfonyl group, sulfamoyl group, or R(C=X)-group; $R^{35}$ represents a hydrogen atom, perfluoroalkyl group, cyano group, oxycarbonyl group, carbamoyl group, sulfonyl group, sulfamoyl group, or R(C=X)-group; R represents an aliphatic hydrocarbon group, aryl group, or heterocyclic group; X represents an oxygen atom, sulfur atom, N—$R^{A1}$, or $CR^{A2}R^{A3}$; $R^{A1}$, $R^{A2}$ and $R^{A3}$ each independently represents a hydrogen atom or substituent, excluding a case in which $R^{A2}$ and $R^{A3}$ are both hydrogen atoms; $R^{36}$, $R^{37}$, and $R^{38}$ each independently represents a hydrogen atom or a substituent; m represents 0, 1, or 2; p represents 1, 2, or 3; and when p is 2 or 3, two or more combinations of $Ar^{31}$, $R^{34}$, $R^{35}$, $R^{36}$, $R^{37}$, $R^{38}$ and m may be the same or different, and when p is 1, two $R^{32}$s may be the same or different, at least one of the two $R^{32}$s represents an aryl group or heterocyclic group and a case in which $R^{34}$ and $R^{35}$ are cyano groups at the same time is excluded; and when $R^{35}$ is a hydrogen atom, $R^{34}$ represents a heterocyclic group which has aromatic rings and is formed from 3 to 7 rings A fourth aspect of the present invention is a light emitting element material according to the second aspect, wherein the compound expressed by the general formula (I) is a compound expressed by following general formula (IV):

General formula (IV)

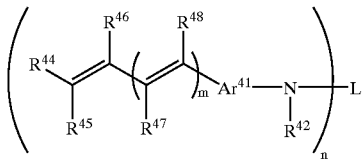

wherein, in the general formula (IV), $Ar^{41}$ represents a divalent aryl group or heterocyclic group; $R^{42}$ represents an aryl group, heterocyclic group, or aliphatic hydrocarbon group; $R^{44}$ represents a heterocyclic group, perfluoroalkyl group, cyano group, oxycarbonyl group, carbamoyl group, sulfonyl group, sulfamoyl group, or R(C=X)-group; $R^{45}$ represents a hydrogen atom, cyano group, perfluoroalkyl group, oxycarbonyl group, carbamoyl group, sulfonyl group, sulfamoyl group, or R(C=X)-group; R represents an aliphatic hydrocarbon group, aryl group, or heterocyclic group; X represents an oxygen atom, sulfur atom, N—$R^{41}$, or $CR^{A2}R^{A3}$; $R^{A1}$, $R^{A2}$ and $R^{A3}$ each independently represents a hydrogen atom or substituent, excluding a case in which $R^{A2}$ and $R^{A3}$ are both hydrogen atoms; $R^{46}$, $R^{47}$, and $R^{48}$ each independently represents a hydrogen atom or substituent; m represents 0, 1, or 2; n represents an integer no than 2; two or more combinations of $Ar^{41}$, $R^{42}$, $R^{44}$, $R^{46}$, $R^{47}$, $R^{48}$, and m may be the same or different; L represents a linkage group having a valence of n; and at least two of the $Ar^{41}$, $R^{42}$, and L each independently represents an aryl group or heterocyclic group.

A fifth aspect of the present invention is a light emitting element material according to the third aspect, wherein the compound expressed by the general formula (III) is a compound expressed by following general formula (V):

General formula (V)

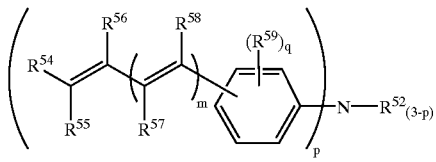

wherein, in the general formula (V), $R^{52}$ represents an aryl group, heterocyclic group, or aliphatic hydrocarbon group; $R^{54}$ represents a heterocyclic group, perfluoroalkyl group, cyano group, oxycarbonyl group, carbamoyl group, sulfonyl group, sulfamoyl group, or R(C=X)-group; $R^{55}$ represents a hydrogen atom, perfluoroalkyl group, cyano group, oxycarbonyl group, carbamoyl group, sulfonyl group, sulfamoyl group, or R(C=X)-group; R represents an aliphatic hydrocarbon group, aryl group, or heterocyclic group; X represents an oxygen atom, sulfur atom, N—$R^{A1}$, or $CR^{A2}R^{A3}$; $R^{A1}$, $R^{A2}$ and $R^{A3}$ each independently represents a hydrogen atom or substituent, excluding a case in which $R^{A2}$ and $R^{A3}$ are both hydrogen atoms; $R^{56}$, $R^{57}$, and $R^{58}$ each independently represents a hydrogen atom or substituent; $R^{59}$ represents a substituent; q represents an integer from 0 to 4; when q is 2, 3, or 4, two or more $R^{59}$s may be the same or different; m represents 0, 1, or 2; p represents 1, 2, or 3; when p is 2 or 3, two or more combinations of $R^{52}$, $R^{54}$, $R^{55}$, $R^{56}$, $R^{57}$, $R^{58}$, $R^{59}$, m, and q may be the same or different, and when p is 1, at least one of the two $R^{52}$s represents an aryl group or heterocyclic group and a case where $R^{54}$ and $R^{55}$ are both cyano groups is excluded; and when $R^{55}$ is a hydrogen atom, $R^{54}$ represents a heterocyclic group which has aromatic rings and is formed from 3 to 7 rings.

A sixth aspect of the present invention is a light emitting element material according to the fourth aspect, wherein the compound expressed by the general formula (IV) is a compound expressed by following general formula (VI):

General formula (VI)

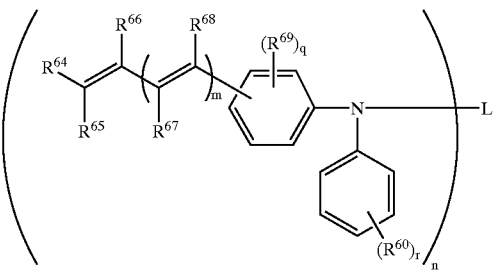

wherein, in the general formula (VI), $R^{64}$ represents a heterocyclic group, a perfluoroalkyl group, cyano group, oxycarbonyl group, carbamoyl group, sulfonyl group, sulfamoyl group, or R(C=X)-group; $R^{65}$ represents a hydrogen atom, perfluoroakyl group, cyano group, oxycarbonyl group, carbamoyl group, sulfonyl group, sulfamoyl group, or R(C=X)-group; R represents an aliphatic hydrocarbon group, aryl group, or heterocyclic group; X represents an oxygen atom, sulfur atom, N—$R^{A1}$, or $CR^{A2}R^{A3}$; $R^{A1}$, $R^{A2}$ and $R^{A3}$ each independently represents a hydrogen atom or substituent, excluding a case in which $R^{A2}$ and $R^{A3}$ are both hydrogen atoms; $R^{66}$, $R^{67}$, and $R^{68}$ each independently represents a hydrogen atom or substituent; $R^{69}$ and $R^{60}$ each independently represents a substituent; q represents an integer which is of from 0 to 4; r represents an integer which is of from 0 to 5; when q is 2, 3, or 4 and when r is 2, 3, 4, or 5, two or more $R^{69}$s and two or more $R^{60}$s may be the same or different, respectively; m represents 0, 1, or 2; n represents an integer which is no less than 2; two or more combinations of $R^{60}$, $R^{64}$, $R^{65}$, $R^{66}$, $R^{67}$, $R^{68}$, $R^{69}$, m, q, and r may be the same or different from each other; and L represents a linkage group having a valence of n.

A seventh aspect of the present invention is a light emitting element material according to the fifth aspect, wherein the compound expressed by the general formula (V) is a compound expressed by following general formula (VII):

General formula (VII)

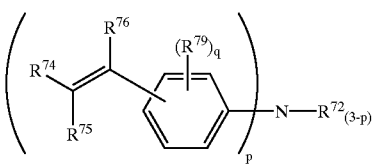

wherein, in the general formula (VII), $R^{72}$ represents an aryl group, heterocyclic group, or aliphatic hydrocarbon group; $R^{74}$ represents a heterocyclic group, perfluoroalkyl group, cyano group, oxycarbonyl group, carbamoyl group, sulfonyl group, sulfamoyl group, or R(C=X)-group; $R^{75}$ represents a hydrogen atom, perfluoroalkyl group, cyano group, oxycarbonyl group, carbamoyl group, sulfonyl group, sulfamoyl group, or R(C=X)-group; R represents an aliphatic hydrocarbon group, aryl group, or heterocyclic group; X represents an oxygen atom, sulfur atom, N—$R^{A1}$, or $CR^{A2}R^{A3}$; $R^{A1}$, $R^{A2}$ and $R^{A3}$ each independently represents a hydrogen atom or a substituent, excluding a case in which $R^{A2}$ and $R^{A3}$ are both hydrogen atoms; $R^{76}$ represents a hydrogen atom or substituent; $R^{79}$ represents a substituent; q represents an integer which is of from 0 to 4; when q is 2, 3, or 4, two or more $R^{79}$s may be the same or different; p represents 1, 2, or 3; and when p is 2 or 3, two or more combinations of $R^{72}$, $R^{74}$, $R^{75}$, $R^{76}$, $R^{79}$, and q may be the same or may be different, and when p is 1, two $R^{72}$s may be the same or different, and at least one of the two $R^{72}$s represents an aryl group or heterocyclic group, excluding a case in which $R^{74}$ and $R^{75}$ are cyano groups at the same time; and when $R^{75}$ is a hydrogen atom, $R^{74}$ represents a heterocyclic group which has aromatic rings and is formed from 3 to 7 rings.

An eighth aspect of the present invention is a light emitting element material according to the sixth aspect, wherein the compound expressed by the general formula (VI) is a compound expressed by following general formula (VIII):

General formula (VIII)

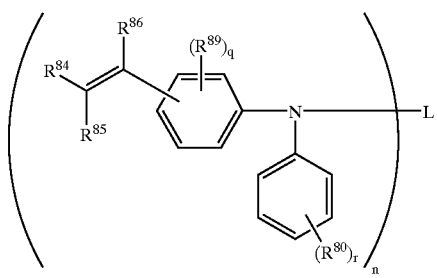

wherein, in the general formula (VIII), $R^{84}$ represents a heterocyclic group, perfluoroalkyl group, cyano group, oxycarbonyl group, carbamoyl group, sulfonyl group, sulfamoyl group, or R(C=X)-group; $R^{85}$ represents a hydrogen atom, perfluoroalkyl group, cyano group, oxycarbonyl group, carbamoyl group, sulfonyl group, sulfamoyl group, or R(C=X)-group; R represents an aliphatic hydrocarbon group, aryl group, or heterocyclic group; X represents an oxygen atom, sulfur atom, N—$R^{A1}$, or $CR^{A2}R^{A3}$; $R^{A1}$, $R^{A2}$ and $R^{A3}$ each independently represents a hydrogen atom or substituent, excluding a case in which $R^{A2}$ and $R^{A3}$ are both hydrogen atoms; $R^{86}$ represents a hydrogen atom or a substituent; $R^{89}$ and $R^{80}$ each independently represents a substituent; q represents an integer which is of from 0 to 4; r represents an integer which is of from 0 to 5; when q is 2, 3, or 4 and when r is 2, 3, 4, or 5, two or more $R^{89}$s and two or more $R^{80}$s may be the same or different, respectively; n represents an integer which is no less than 2; two or more combinations of $R^{80}$, $R^{84}$, $R^{85}$, $R^{86}$, $R^{89}$, q, and r may be the same or different; and L represents a linkage group having a valence of n.

An ninth aspect of the present invention is an amine compound which is expressed by following general formula (IX):

General formula (IX)

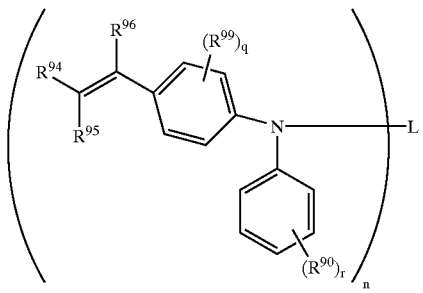

wherein, in the general formula (IX), $R^{94}$ represents a heterocyclic group, perfluoroalkyl group, cyano group, oxycarbonyl group, carbamoyl group, sulfonyl group, sulfamoyl group, or R(C=X)-group; $R^{95}$ represents a hydrogen atom, perfluoroalkyl group, cyano group, oxycarbonyl group, carbamoyl group, sulfonyl group, sulfamoyl group, or R(C=X)-group; R represents an aliphatic hydrocarbon group, aryl group, or heterocyclic group; X represents an oxygen atom, sulfur atom, N—$R^{A1}$, or $CR^{A2}R^{A3}$; $R^{A1}$, $R^{A2}$ and $R^{A3}$ each independently represents a hydrogen atom or substituent, excluding a case in which $R^{A2}$ and $R^{A3}$ are both hydrogen atoms; $R^{96}$ represents a hydrogen atom or substituent; $R^{99}$ and $R^{90}$ each independently represents a substituent; q represents an integer which is of from 0 to 4; r represents an integer which is of from 0 to 5; when q is 2, 3, or 4 and when r is 2, 3, 4, or 5, a plurality of $R^{99}$ and a plurality of $R^{90}$ may be the same or different, respectively; n represents an integer which is no less than 2; two or more combinations of $R^{90}$, $R^{94}$, $R^{95}$, $R^{96}$, $R^{99}$, q, and r may be the same or different; and L represents a linkage group having a valence of n.

A tenth aspect of the present invention is a light emitting element comprising a pair of electrodes and one or more organic thin film layers provided between the pair of electrodes, wherein at least one organic thin film layer contains at least one light emitting element material according to any one of the first, second, third, fifth or seventh aspects.

An eleventh aspect of the present invention is a light emitting element according to the tenth aspect, wherein the light emitting element material is dispersed in a polymer.

DESCRIPTION OF THE PREFERRED EMBODIMENTS

① Compound Expressed by General Formula (A):

General formula (A)

wherein, in the general formula (A), $R^1$, $R^2$, and $R^3$ may be the same or different, and each independently represents an aryl group, heterocyclic group, or an aliphatic hydrocarbon group; and at least two of the $R^1$, $R^2$, and $R^3$ each independently represents an aryl group or heterocyclic group.

The aryl group expressed by $R^1$, $R^2$, and $R^3$ is, preferably an aryl group with a single ring or two to four rings and having 6 to 30 carbons (examples thereof include a phenyl group, naphthyl group, anthryl group, phenanthryl group, pyrenyl group, indenyl group, and the like), more preferably a phenyl group, naphthyl group, anthryl group or phenanthryl group having 6 to 20 carbons, and even more preferably a phenyl group, naphthyl group or phenanthryl group having 6 to 14 carbons.

The heterocyclic group expressed by $R^1$, $R^2$, and $R^3$ is a saturated or unsaturated heterocyclic group having 3 to 10 members which includes at least one of a nitrogen atom, an oxygen atom, and a sulfur atom. These heterocyclic groups may have a single ring structure, and further, may form a fused ring with other rings. The heterocyclic group is, preferably an aromatic heterocyclic group having 5 to 6 members, more preferably an aromatic heterocyclic group having 5 to 6 members which includes a nitrogen atom, oxygen atom, or sulfur atom, and even more preferably an aromatic heterocyclic group having 5 to 6 members which includes 1 to 2 nitrogen atoms or 1 to 2 sulfur atoms.

Specific examples of the aromatic heterocycle include a pyrolidine, piperidine, piperazine, morpholine, thiophene, furan, pyrrole, imidazole, pyrazole, pyridine, pyrazine, pyridazine, triazole, triazine, indole, indazole, purine, thiazoline, thiazole, thiadiazole, oxazoline, oxazole, oxadiazole, quinoline, isoquinoline, phthalazine, naphthyridine, quinoxaline, quinazoline, cinnoline, pteridine, acridinephenanthroline, phenazine, tetrazole, benzimidazole, benzoxazole, benzothiazole, benzotriazole, tetrazaindene, and the like. Among them, a thiophene, pyridine, and quinoline are preferable.

Examples of the aliphatic hydrocarbon group represented by $R^1$, $R^2$, and $R^3$ include a linear, branched, or cyclic alkyl group (a linear, branched, or cyclic alkyl group having 1 to 20 carbons is preferable, one having 1 to 12 carbons is more preferable, and one having 1 to 8 carbons is particularly preferable; examples thereof include a methyl group, ethyl group, isopropyl group, tert-butyl group, n-octyl group, n-decyl group, n-hexadecyl group, cyclopropyl group, cyclopentyl group, cyclohexyl group, and the like); alkenyl group (a linear, branched, or cyclic alkenyl group having 2 to 20 carbons is preferable, one having 2 to 12 carbons is more preferable, and one having 2 to 8 carbons is particularly preferable; and examples thereof include a vinyl group, allyl group, 2-butenyl group, 3-pentenyl group, and the like), allynyl group (a linear, branched, or cyclic alkynyl group having 2 to 20 carbons is preferable, one having 2 to 12 carbons is more preferable, and one having 2 to 8 carbons is particularly preferable; examples thereof include a propargyl group, 3-pentynyl group, and the like). Among them, the alkyl group is preferable.

The aryl group, heterocyclic group, and aliphatic hydrocarbon group represented by $R^1$, $R^2$, and $R^3$ may have substituents. Examples of such substituents include an alkyl group (an alkyl group having 1 to 20 carbons is preferable, one having 1 to 12 carbons is more preferable, and one having 1 to 8 carbons is particularly preferable; examples thereof include a methyl group, ethyl group, isopropyl group, tert-butyl group, n-octyl group, n-decyl group, n-hexadecyl group, cyclopropyl group, cyclopentyl group, cyclohexyl group, and the like); alkenyl group (an alkenyl group having 2 to 20 carbons is preferable, one having 2 to 12 carbons is more preferable, and one having 2 to 8 carbons is particularly preferable; examples thereof.include a vinyl group, allyl group, 2-butenyl group, 3-pentenyl group, and the like); alkynyl group (one having 2 to 20 carbons is preferable, and one having 2 to 12 carbons is more preferable, and one having 2 to 8 carbons is particularly preferable; examples thereof include a propargyl group, 3-pentynyl group, and the like); aryl group (an aryl group having 6 to 30 carbons is preferable, one having 6 to 20 carbons is more preferable, and one having 6 to 12 carbons is particularly preferable; examples thereof include a phenyl group, p-methylphenyl group, naphthyl group, and the like); amino group (an amino group having 0 to 20 carbons is preferable, one having 0 to 10 carbons is more preferable, and one having 0 to 6 carbons is particularly preferable; examples thereof include an amino group, methylamino group, dimethylamino group, diethylamino group, dibenzylamino group, and the like); alkoxy group (an alkoxy group having 1 to 20 carbons is preferable, one having 1 to 12 carbons is more preferable, and one having 1 to 8 carbons is particularly preferable; examples thereof include a methoxy group, ethoxy group, butoxy group, and the like); aryloxy group (an aryloxy group having 6 to 20 carbons is preferable, one having 6 to 16 carbons is more preferable, and one having 6 to 12 carbons is particularly preferable; examples thereof include a phenyloxy group, 2-naphthyloxy group, and the like); acyl group (an acyl group having 1 to 20 carbons is preferable, one having 1 to 16 carbons is more preferable, and one having 1 to 12 carbons is particularly preferable; examples thereof include an acetyl group, benzoyl group, formyl group, pivaloyl group, and the like); alkoxycarbonyl group (an alkoxycarbonyl group having 2 to 20 carbons is preferable, one having 2 to 16 carbons is more preferable, and one having 2 to 12 carbons is particularly preferable; examples thereof include a methoxycarbonyl group, ethoxycarbonyl group, and the like); aryloxycarbonyl group (an aryloxycarbonyl group having 7 to 20 carbons is preferable, one having 7 to 16 carbons is more preferable, and one having 7 to 10 carbons is particularly preferable; examples thereof include a phenyloxycarbonyl group, and the like); acyloxy group (an acyloxy group having 2 to 20 carbons is preferable, one having 2 to 16 carbons is more preferable, and one having 2 to 10 carbons is particularly preferable; examples thereof include an acetoxy group, benzoyloxy group, and the like); acylamino group (an acylamino group having 2 to 20 carbons is preferable, one having 2 to 16 carbons is more preferable, and one having 2 to 10 carbons is particularly preferable; examples thereof include an acetylamino group, benzoylamino group, and the like); alkoxycarbonylamino group (an alkoxycarbonylamino group having 2 to 20 carbons is preferable, one having 2 to 16 carbons is more preferable, and one having 2 to 12 carbons is particularly preferable; examples thereof include a methoxycarbonylamino group, and the like); aryloxycarbonylamino group (an aryloxycarbonylamino group having 7 to 20 carbons is preferable, one having 7 to 16 carbons is more preferable, and one having 7 to 12 carbons is particularly preferable; examples thereof include a phenyloxycarbonylamino group, and the like); sulfonylamino group (a sulfonylamino group having 1 to 20 carbons is preferable, one having 1 to 16 carbons is more preferable, and one having 1 to 12 carbons is particularly preferable; examples thereof include a methanesulfonylamino group, benzenesulfonylamino group, and the like); sulfamoyl group (a sulfamoyl group having 0 to 20 carbons is preferable, one having 0 to 16 carbons is more preferable, and one having 0 to 12 carbons is particularly preferable; examples thereof include a sulfamoyl group, methylsulfamoyl group, dimethylsulfamoyl group, phenylsulfamoyl group, and the like); carbamoyl group (a carbamoyl group having 1 to 20 carbons is preferable, one having 1 to 16 carbons is more preferable, and one having 1 to 12 carbons is particularly preferable; examples thereof include a carbamoyl group, methylcarbamoyl group, diethylcarbamoyl group, phenylcarbamoyl group, and the like); alkylthio group (an alkylthio group having 1 to 20 carbons is preferable, one having 1 to 16 carbons is more preferable, and one having 1 to 12 carbons is particularly preferable; examples thereof include a methylthio group, ethylthio group, and the like); arylthio group (an arylthio group having 6 to 20 carbons is preferable, one having 6 to 16 carbons is more preferable, and one having 6 to 12 carbons is particularly preferable; examples thereof include a phenylthio group, and the like); sulfonyl group (a sulfonyl group having 1 to 20 carbons is preferable, one having 1 to 16 carbons is more preferable, and one having 1 to 12 carbons is particularly preferable; examples thereof include a mesyl group, tosyl group, and the like); sulfinyl group (a sulfinyl group having 1 to 20 carbons is preferable, one having 1 to 16 carbons is more preferable, and one having 1 to 12 carbons is particularly preferable; examples thereof include a methanesulfinyl group, benzenesulfinyl group, and the like); ureido group (an ureido group having 1 to 20 carbons is preferable, one having 1 to 16 carbons is more preferable, and one having 1 to 12 carbons is particularly preferable; examples thereof include an ureido group, methylureido group, phenylureido group, and the like); phosphoricamide group (a phosphoricamide group having 1 to 20 carbons is preferable, one having 1 to 16 carbons is more preferable, and one having 1 to 12 carbons is particularly preferable; examples thereof include a diethylphosphoricamide group, phenylphosphoricamide group, and the like); hydroxy group; mercapto group; halogen atom (for example, a fluorine atom, chlorine atom, bromine atom, and iodine atom); cyano group; sulfo group; carboxyl group; nitro group; hydroxamic acid group; sulfino group; hydrazino group; imino group; heterocyclic group (a heterocyclic group having 1 to 20 carbons is preferable, and one having 1 to 12 carbons is more preferable; examples of a hetero atom include a nitrogen atom, oxygen atom, sulfur atom, and the like, and specific examples of the heterocyclic group include a pyrolidine, piperidine, piperazine, morpholine, thiophene, furan, pyrrole, imidazole, pyrazole, pyridine, pyrazine, pyridazine, triazole, triazine, indole, indazole, purine, thiazoline, thiazole, thiadiazole, oxazoline, oxazole, oxadiazole, quinoline, isoquinoline, phthalazine, naphthyridine, quinoxaline, quinazoline, cinnoline, pteridine, acridinephenanthroline, phenazine, tetrazole, benzimidazole, benzoxazole, benzothiazole, benzotriazole, tetrazaindene, carbazole, benzoazepine, and the like); silyl group (a silyl group having 3 to 40 carbons is preferable, one having 3 to 30 carbons is more preferable, and one having 3 to 24 carbons is particularly preferable; examples thereof include a trimethylsilyl group, triphenylsilyl group, and the like); and the like.

These substituents may be substituted further. Moreover, in a case in which there are two or more substituents, the two or more substituents may be the same or different. Further, in a case in which it is possible, they may combine with each other to form a ring.

Among the substituents given as examples, an alkyl group, alkenyl group, aralkyl group, aryl group, alkoxy group, amino group, acyl group, alkoxycarbonyl group, aryloxycarbonyl group, carbonylamino group, sulfonylamino group, sulfamoyl group, carbamoyl group, hydroxy group, and heterocyclic group are preferable; an alkyl group, alkenyl group, aralkyl group, aryl group, alkoxy group, amino group, carbonylamino group, sulfonylamino group, and heterocyclic group are more preferable; and, an alkyl group, alkenyl group, aryl group, alkoxy group, and substituted amino group are particularly preferable. Here, the substituted amino group is a group represented by —NR$^a$(R$^b$), and R$^a$ and R$^b$ may be the same or different, and each independently represents an alkyl group, alkenyl group, aralkyl group, aryl group, or heterocyclic group.

Further, R$^1$, R$^2$, and R$^3$ may combine with each other to form a ring having 5 to 7 members.

Examples of a 5 membered ring formed by R$^1$, R$^2$ and R$^3$ include a carbazole and the like. Examples of the 6 membered ring formed by R$^1$, R$^2$ and R$^3$ include a phenothiazine, phenoxazine, acrydone, and the like. Examples of the 7 membered ring formed by R$^1$, R$^2$, and R$^3$ include a dibenzoazepine, tribenzoazepine, dihydrobenzoazepine, and the like.

In the general formula (A), at least one of the R$^1$, R$^2$, and R$^3$ contains a group expressed by following general formula (B):

General formula (B)

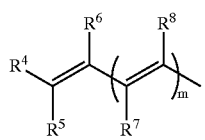

wherein, in the general formula (B), R$^4$ represents a heterocyclic group or electron attracting group; R$^5$ represents a hydrogen atom or electron attracting group; the heterocyclic group represented by R$^4$ is a saturated or unsaturated heterocyclic group having 3 to 10 members which includes at least one of a nitrogen atom, oxygen atom, and sulfur atom, and these (heterocyclic groups) may be a single ring, and further, may form a fused ring with other rings; and, as the heterocyclic group, an aromatic heterocyclic group having 5 to 6 members is preferable, and an aromatic heterocyclic group having 5 to 6 members which includes a nitrogen atom, oxygen atom, or a sulfur atom is more preferable, and an aromatic heterocyclic group having 5 to 6 members which includes 1 to 2 nitrogen atoms or 1 to 2 sulfur atoms is particularly preferable.

Specific examples of the aromatic heterocycle include a pyrolidine, piperidine, piperazine, morpholine, thiophene, furan, pyrrole, imidazole, pyrazole, pyridine, pyrazine, pyridazine, triazole, triazine, indole, indazole, purine, thiazoline, thiazole, thiadiazole, oxazoline, oxazole, oxadiazole, quinoline, isoquinoline, phthalazine, naphthyridine, quinoxaline, quinazoline, cinnoline, pteridine, acridinephenanthroline, phenazine, tetrazole, benzimidazole, benzoxazole, benzothiazole, benzotriazole, tetrazaindene, and the like. These may have substituents, and may form fused rings.

Examples of such substituents include the examples of substituents for R$^1$, R$^2$, and R$^3$, and examples of such fused rings include a benzo fused ring, naphth fused ring, and hetero fused ring.

Preferable examples of the heterocycle include thiophene, furan, pyrrole, imidazole, pyrazole, pyridine, pyrazine, pyridazine, triazole, triazine, indole, indazole, thiazoline, thiazole, thiadiazole, oxazoline, oxazole, oxadiazole, quinoline, benzimidazole, benzoxazole, benzothiazole, and benzotriazole.

As an electron attracting group represented by R$^4$ and R$^5$, a group having a Hammett value of σ p >0.35 is preferable. Examples of such electron attracting groups include a cyano group, perfluoroalkyl group, oxycarbonyl group, carbamoyl group, sulfonyl group, sulfamoyl group, sulfinyl group, R(C=X) group (R and X are defined in the same manner as R and X in following general formula (II)), formyl group, carboxyl group, pentafluorophenyl group, perfluoroalkylamino group, perfluoroalkyloxy group, ester phosphonate, amido phosphonate, sulfonyloxy group, ammonio group, azo group, nitro group, nitroso group, electron deficiency heterocyclic group, and the like. However, in a case in which only one group represented by the general formula (B) is contained in the general formula (A), $R^4$ and $R^5$ can not both be a cyano group, and such compound is excluded.

In the general formula (B), $R^6$, $R^7$, and $R^8$ each independently represents a hydrogen atom or substituent. Examples of substituents that $R^6$, $R^7$, and $R^8$ each represents include the examples of the substituents for an aryl group, heterocyclic group, and aliphatic hydrocarbon group represented by $R^1$, $R^2$, and $R^3$. Further, $R^6$, $R^7$, and $R^8$ may combine with each other to form a ring, and may combine with $R^1$, $R^2$, and $R^3$, respectively, to form a ring. Examples of the ring include a saturated or unsaturated carbon cycle or heterocycle, which each have 5 to 7 members, and the ring may be a fused ring m represents 0, 1, or 2. Among these integers, m=0 or 1 is preferable, and m=0 is more preferable.

Regarding the compound expressed by the general formula (A), preferable combinations of $R^1$–$R^8$ will be explained.

$R^1$, $R^2$, and $R^3$ may be the same or different from each other. Preferably, each of the $R^1$, $R^2$, and $R^3$ is an aryl group with a single ring or two to four rings and having 6 to 30 carbons (for example, a phenyl group, naphthyl group, anthryl group, phenanthryl group, pyrenyl group, indenyl group, and the like); aromatic heterocyclic group having 5 to 6 members which contains a nitrogen atom, oxygen atom, or sulfur atom; or alkyl group, alkenyl group, or alkynyl group having 1 to 20 carbons; and at least two of the $R^1$, $R^2$, and $R^3$ each independently represent one of the preferable aryl groups or the preferable heterocyclic groups, and at least one of the $R^1$, $R^2$, and $R^3$ contains a group expressed by the general formula (B), as a substituent. $R^1$, $R^2$, and $R^3$ may each independently have substituents, and, preferable examples of such substituents include an alkyl group, alkenyl group, aralkyl group, aryl group, alkoxy group, amino group, acyl group, alkoxycarbonyl group, aryloxycarbonyl group, carbonylamino group, sulfonylamino group, sulfamoyl group, carbamoyl group, hydroxy group, and heterocyclic group. These substituents may be substituted further.

In the general formula (B), $R^6$, $R^7$, and $R^8$ each independently represents a hydrogen atom or substituent, and preferable examples of the substituent include an alkyl group having 1 to 20 carbons, alkoxy group having 1 to 20 carbons, alkylthio group having 1 to 20 carbons, alkenyl group having 2 to 20 carbons, acyl group having 2 to 20 carbons, sulfonyl group having 1 to 20 groups, alkoxycarbonyl group having 2 to 20 carbons, and carbonamide group having 1 to 20 carbons, and cyano group. $R^4$ represents a heterocyclic group or electron attracting group, and $R^5$ represents a hydrogen atom or electron attracting group. As the electron attracting group, an electron attracting group in which σp>0.35 is preferable. It is preferable that the sum of the σp of the electron attracting groups of $R^4$ and $R^5$ is from 0.35 or more to 1.3 or less.

A further preferable aspect of the compound expressed by the general formula (A) is a compound expressed by following general formula (I).

② Compound Expressed by General Formula (I):

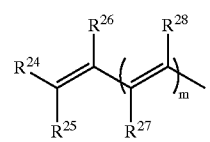

General formula (I)

wherein, in the general formula (I), $R^{21}$, $R^{22}$, and $R^{23}$ may be the same or different from each other, and each independently represents an aryl group, heterocyclic group, or aliphatic hydrocarbon group; at least two of the $R^{21}$, $R^{22}$, and $R^{23}$ each independently represents an aryl group or heterocyclic group; the $R^{21}$, $R^{22}$, and $R^{23}$ may each have substituents, and at least one of the $R^{21}$, $R^{22}$, and $R^{23}$ contains a group expressed by following general formula (II):

General formula (II)

wherein, in the general formula (II), $R^{24}$ represents a heterocyclic group, cyano group, perfluoroalkyl group, oxycarbonyl group, carbamoyl group, sulfonyl group, sulfamoyl group, or R(C=X)-group; $R^{25}$ represents a hydrogen atom, cyano group, perfluoroalkyl group, oxycarbonyl group, carbamoyl group, sulfonyl group, sulfamoyl group, or R(C=X)-group; R represents an aliphatic hydrocarbon group, aryl group, or heterocyclic group; X represents an oxygen atom, sulfur atom, N—$R^{A1}$, or $CR^{A2}R^{A3}$; $R^{A1}$, $R^{A2}$, and $R^{A3}$ each independently represents a hydrogen atom or substituent; $R^{26}$, $R^{27}$, and $R^{28}$ each independently represents a hydrogen atom or substituent; and m represents 0, 1, or 2. However, in a case in which only one group represented by the general formula (II) is contained in the general formula (I), $R^{24}$ and $R^{25}$ do not represent a cyano group at the same time. When $R^{25}$ is a hydrogen atom, $R^{24}$ represents a heterocyclic group which has aromatic rings and is formed from 3 to 7 rings.

Further, $R^{21}$, $R^{22}$, and $R^{23}$ in the general formula (I), and $R^{26}$, $R^{27}$, and $R^{28}$ in the general formula (II) have the same definition as $R^1$, $R^2$, and $R^3$ in the general formula (A), and $R^6$, $R^7$, and $R^8$ in the general formula (B), respectively.

The heterocyclic group represented by $R^{24}$ have the same description as the heterocyclic group described with regards to $R^{24}$ in the general formula (B).

The perfluoroalkyl group represented by $R^{24}$ and $R^{25}$ may have a linear, branched, or cyclic alkyl group having a fluorine as a substituent (preferably a linear, branched, or cyclic alkyl group having 1 to 30 carbons, more preferably one having 1 to 20 carbons, and particularly preferably one having 1 to 12 carbons; examples thereof include a trifluoromethyl group, pentafluoromethyl group, and the like).

An oxycarbonyl group, carbamoyl group, sulfonyl group, and sulfamoyl group represented by $R^{24}$ and $R^{25}$ are respectively an oxycarbonyl group, carbamoyl group, sulfonyl group, and sulfamoyl group each substituted with an aliphatic hydrocarbon, aryl group or heterocyclic group. Examples of the aliphatic hydrocarbon which substitutes the oxycarbonyl group, carbamoyl group, sulfonyl group, and the sulfamoyl group include a linear, branched, or cyclic alkyl group (preferably a linear, branched, or cyclic alkyl group having 1 to 30 carbons, more preferably one having 1 to 20 carbons, and particularly preferably one having 1 to 12 carbons; examples thereof include a methyl group, ethyl group, isopropyl group, tert-butyl group, n-octyl group, n-decyl group, n-hexadecyl group, cyclopropyl group, cyclopentyl group, cyclohexyl group, trifluoromethyl group, and the like), alkenyl group (an alkenyl group having 2 to 30 carbons, more preferably one having 2 to 20 carbons, and particularly preferably one having 2 to 12 carbons; examples thereof include a vinyl group, allyl group, 2-butenyl- group, 3-pentenyl group, and the like), alkynyl group (preferably an alkynyl group having 2 to 30 carbons, more preferably one having 2 to 20 carbons, and particularly preferably one having 2 to 12 carbons; examples thereof include a propargyl group, 3-pentynyl group, and the like); an alkyl group and alkenyl group are preferable; and, a methyl group, ethyl group, propyl group, butyl group, trifluoromethyl group, allyl group and the like are more preferable.

Examples of the aryl group which substitute the oxycarbonyl group, carbamoyl group, sulfonyl group, or sulfamoyl group include: preferably an aryl group with a single ring or two rings and having 6 to 30 carbons (for example, a phenyl group, naphthyl group, and the like), more preferably a phenyl group having 6 to 20 carbons, and particularly preferably, a phenyl group having 6 to 12 carbons, and the like. Examples of the heterocyclic group which substitute the oxycarbonyl group, carbamoyl group, sulfonyl group, or sulfamoyl group include a saturated or unsaturated heterocycle having 3 to 10 members which contains at least one of a nitrogen atom, oxygen atom, and a sulfur atom, wherein the heterocyclic group may be a single ring, or may further form a fused ring with other rings. This heterocyclic group has the same description as the heterocyclic group represented by the $R^4$.

R in R(C=X)-group expressed by $R^{24}$ and $R^{25}$ represents an aliphatic hydrocarbon group, aryl group, or a heterocyclic group, which have the same respective definitions as the aliphatic hydrocarbon group, aryl group, or the heterocyclic group which were described with regards to the oxycarbonyl group, carbamoyl group, sulfonyl group, and the sulfamoyl group represented by the $R^4$. X represents an oxygen atom, sulfur atom, N—$R^{A1}$, or $CR^{A2}R^{A3}$. $R^{A1}$, $R^{A2}$ and $R^{A3}$ represent a hydrogen atom or substituent, respectively. An aliphatic hydrocarbon group, aryl group, and heterocyclic group represented by $R^{A1}$ have the same definitions as the aliphatic hydrocarbon group, aryl group, and heterocyclic group, respectively, which were described with regards to the oxycarbonyl group, carbamoyl group, sulfonyl group, and sulfamoyl group. These may have substituents, and examples of such substituents are the same as those given as substituents for $R^1$, $R^2$, and $R^3$. As $R^{A1}$, an alkyl group, alkenyl group, and aryl group are preferable, and an alkyl group and phenyl group are more preferable.

Examples of the substituents represented by $R^{A2}$ and $R^{A3}$ are the same as those illustrated as substituents for $R^1$, $R^2$, and $R^3$. Preferably, $R^{A2}$ and $R^{A3}$ each independently represents a hydrogen atom, cyano group, oxycarbonyl group, acyl group, sulfonyl group, thioether group, carbamoyl group, or a sulfamoyl group (however, $R^{A2}$ and $R^{A3}$ are not both hydrogen atoms). The oxycarbonyl group, acyl group, sulfonyl group, or thioether group represented by $R^{A2}$ and $R^{A3}$ are respectively the oxycarbonyl group, acyl group, sulfonyl group, or thioether group which were substituted with an aliphatic hydrocarbon group, aryl group, or heterocyclic group. In this case, some of the aliphatic hydrocarbon group, aryl group, and the heterocyclic group have the same definition as the aliphatic hydrocarbon group, aryl group, and heterocyclic group represented by the $R^{A1}$. The carbamoyl group or sulfamoyl group represented by $R^{A2}$ and $R^{A3}$ are an unsubstituted carbamoyl group and sulfamoyl group, or a carbamoyl group and sulfamoyl group which were substituted with an aliphatic hydrocarbon group, aryl group, and heterocyclic group. Some of the aliphatic hydrocarbon group, aryl group, and the heterocyclic group in this case have the same definition as the aliphatic hydrocarbon group, aryl group, and heterocyclic group represented by the $R^{A1}$.

Regarding the compound expressed by the general formula (I), preferable combinations of $R^{21}$–$R^{28}$ will be explained.

The preferable combinations of $R^{21}$, $R^{22}$, $R^{23}$, $R^{26}$, $R^{27}$ and $R^{28}$ are the same as those for $R^1$, $R^2$, $R^3$, $R^6$, $R^7$, and $R^8$, in the general formula (A), respectively.

Examples of preferable combinations of $R^{24}$ and $R^{25}$ includes a combination in which $R^{24}$ represents a heterocyclic group, perfluoroalkyl group having 1 to 20 carbons, cyano group, oxycarbonyl group having 2 to 20 carbons, carbamoyl group having 2 to 20 carbons, sulfonyl group having 1 to 20 carbons, sulfamoyl group having 1 to 20 carbons, or R(C=X)-group having 2 to 20 carbons, and $R^{25}$ represents a hydrogen atom, perfluoroalkyl group having 1 to 20 carbons, cyano group, oxycarbonyl group having 2 to 20 carbons, carbamoyl group having 2 to 20 carbons, sulfonyl group having 1 to 20 carbons, sulfamoyl group having 1 to 20 carbons, or R(C=X)-group having 2 to 20 carbons.

Examples of combinations of $R^{24}$ and $R^{25}$ which are more preferable include a combination in which, when $R^{24}$ represents a heterocyclic group, $R^{25}$ represents a hydrogen atom, perfluoroalkyl group having 1 to 20 carbons, cyano group, oxycarbonyl group having 2 to 20 carbons, carbamoyl group having 2 to 20 carbons, sulfonyl group having 1 to 20 carbons, sulfamoyl group having 1 to 20 carbons, or R(C=X)-group having 2 to 20 carbons; and a combination in which, when $R^{24}$ represents an oxycarbonyl group having 2 to 20 carbons, carbamoyl group having 2 to 20 carbons, sulfonyl group having 1 to 20 carbons, or R(C=X)-group having 2 to 20 carbons, $R^{25}$ represents a perfluoroalkyl group having 1 to 20 carbons, cyano group, oxycarbonyl group having 2 to 20 carbons, carbamoyl group having 2 to 20 carbons, sulfonyl group having 1 to 20 carbons, sulfamoyl group having 1 to 20 carbons, or R(C=X)-group having 2 to 20 carbons.

Examples of combinations of $R^{24}$ and $R^{25}$ which are particularly preferable include a combination in which, when $R^{24}$ represents a heterocyclic group, $R^{25}$ represents a perfluoroalkyl group having 1 to 20 carbons, cyano group, oxycarbonyl group having 2 to 20 carbons, carbamoyl group having 2 to 20 carbons, sulfonyl group having 1 to 20 carbons, sulfamoyl group having 1 to 20 carbons, or R(C=X)-group having 2 to 20 carbons; and a combination in which, when $R^{24}$ represents an oxycarbonyl group having 2 to 20 carbons, sulfonyl group having 2 to 20 carbons, or acyl group having 2 to 20 carbons (X in R(C=X)-group is an oxygen atom), $R^{25}$ represents a perfluoroalkyl group having 1 to 20 carbons, cyano group, oxycarbonyl group having 2 to 20 carbons, carbamoyl group having 2 to 20 carbons, sulfonyl group having 1 to 20 carbons, sulfamoyl group having 1 to 20 carbons, or acyl group having 2 to 20 carbons (X in R(C=X)-group is an oxygen atom).

Examples of combinations of $R^{24}$ and $R^{25}$ which are particularly preferable include: a combination in which, when $R^{24}$ represents, as a heterocyclic group, a thiophene, furan, pyrrole, imidazole, pyrazole, pyridine, pyrazine, pyridazine, triazole, triazine, indole, indazole, thiazoline, thiazole, thiadiazole, oxazoline, oxazole, oxadiazole, quinoline, benzimidazole, benzoxazole, benzothiazole, or benzotriazole, $R^{25}$ represents a perfluoroalkyl group having 1 to 20 carbons, cyano group, oxycarbonyl group having 2 to 20 carbons, sulfonyl group having 1 to 20 carbons, sulfamoyl group having 1 to 20 carbons, or an acyl group having 2 to 20 carbons (X in R(C=X)-group is an oxygen atom); and a combination in which, when $R^{24}$ represents an alkyloxycarbonyl group having 2 to 20 carbons, sulfonyl group having 1 to 20 carbons, or an acyl group having 2 to 20 carbons, $R^{25}$ represents a cyano group, alkyloxycarbonyl group having 2 to 20 carbons, sulfonyl group having 1 to 20 carbons, or acyl group having 2 to 20 carbons (X in R(C=X)-group is an oxygen atom); and, as an acyl group for $R^{24}$, an acyl group in which R has a heterocycle is most preferable.

Aspects of the compound expressed by the general formula (I) which are further preferable are compounds expressed by following general formula (III) and following general formula (IV).

③ Compound Expressed by General Formula (III):

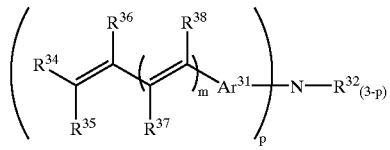

General formula (III)

wherein, in the general formula (III), $Ar^{31}$ represents a divalent aryl group or heterocyclic group; $R^{32}$ represents an aryl group, heterocyclic group, or an aliphatic hydrocarbon group, wherein the aryl group, heterocyclic group, and aliphatic hydrocarbon group have the same respective definition as the aryl group, heterocyclic group, and aliphatic hydrocarbon group which were described with regards to $R^1$, $R^2$, and $R^3$ in the general formula (A), and their preferable ranges are the same as those described for $R^1$, $R^2$, and $R^3$ in the general formula (A); $R^{34}$ represents a heterocyclic group, perfluoroalkyl group, cyano group, oxycarbonyl group, carbamoyl group, sulfonyl group, sulfamoyl group, or R(C=X)-group; $R^{35}$ represents a hydrogen atom, perfluoroalkyl group, cyano group, oxycarbonyl group, carbamoyl group, sulfonyl group, sulfamoyl group, or R(C=X)-group; R represents an aliphatic hydrocarbon group, aryl group, or heterocyclic group, X represents an oxygen atom, sulfur atom, N—$R^{A1}$, or $CR^{A2}R^{A3}$, and $R^{A1}$, $R^{A2}$ and $R^{A3}$ each independently represents a hydrogen atom or substituent; $R^{36}$, $R^{37}$, and $R^{38}$ each independently represents a hydrogen atom or substituent; these $R^{34}$, $R^{35}$, $R^{36}$, $R^{37}$, and $R^{38}$ have the same definition as $R^{24}$, $R^{25}$, $R^{26}$, $R^{27}$, and $R^{28}$ in the general formula (II), respectively; m represents 0, 1, or 2; p represents 1, 2, or 3; when p is 2 or 3, two or more combinations of $Ar^{31}$, $R^{34}$, $R^{35}$, $R^{36}$, $R^{37}$, $R^{38}$ and m may be the same or different and, on the other hand, when p is 1, two $R^{32}$s may be the same or different. However, at least one of the two $R^{32}$s represents an aryl group or heterocyclic group, and, when p is 1, $R^{34}$ and $R^{35}$ are not both cyano groups. When $R^{35}$ is a hydrogen atom, $R^{34}$ represents a heterocyclic group which has aromatic rings and is formed from 3 to 7 rings.

Regarding the compound expressed by the general formula (III), preferable combinations of $Ar^{31}$, $R^{32}$, and $R^{34}$–$R^{38}$ will be explained.

In the general formula (III), when two or more $Ar^{31}$s are present, $Ar^{31}$ may be the same or different. Preferably, $Ar^{31}$ is an aryl group with a single ring or two rings and having 6 to 30 carbons (for example, a phenyl, naphthyl, or the like), an aromatic heterocyclic group having 5 to 6 members which contains a nitrogen atom, oxygen atom, or sulfur atom. $R^{32}$ is an aryl group with a single ring or two to four rings and having 6 to 30 carbons (for example, a phenyl, naphthyl, anthryl, phenanthryl, pyrenyl, indenyl, or the like); an aromatic heterocyclic group having 5 to 6 members which contains a nitrogen atom, oxygen atom, or sulfur atom; or an alkyl group, alkenyl group, or alkynyl group, each having 1 to 20 carbons. $Ar^{31}$ and $R^{32}$ may each have substituents, and preferable examples of such substituents are an alkyl group, alkoxy group, allylthio group, acyl group, and substituted amino group (as examples of the substituent thereof, an alkyl group, alkenyl group, alkynyl group, aryl group, and heterocyclic group can be listed). $R^{36}$, $R^{37}$ and $R^{38}$ each independently represents a hydrogen atom or substituent and preferable examples of the substituent include an alkyl group, alkoxy group, alkylthio group, alkenyl group, acyl group, sulfonyl group, alkoxycarbonyl group, carbonamide group, or cyano group. Examples of the preferable combinations of $R^{34}$ and $R^{35}$ are the same as those of the preferable combinations of $R^{24}$ and $R^{25}$ in the general formula (I). However, when P=1 and $R^{35}$ is a hydrogen atom, $R^{34}$ represents a heterocyclic group which has aromatic rings and is formed from 3 to 7 rings.

An aspect of the compound expressed by the general formula (III) which is further preferable is a compound expressed by general formula (V) which will be described later.

④ Compound Expressed by General Formula (IV):

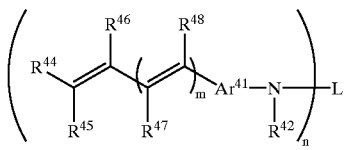

General formula (IV)

wherein, in the general formula (IV), $Ar^{41}$ represents divalent aryl groups or heterocyclic groups; $R^{42}$ represents an aryl group, a heterocyclic group, or aliphatic hydrocarbon group, wherein the aryl group, heterocyclic group, and aliphatic hydrocarbon group have the same respective definitions and the same preferable ranges as the aryl group, heterocyclic group, and aliphatic hydrocarbon group which were described with regards to $R^1$, $R^2$, and $R^3$ in the general formula (A); $R^{44}$ represents a heterocyclic group, perfluoroalkyl group, cyano group, oxycarbonyl group, carbamoyl group, sulfonyl group, sulfamoyl group, or R(C=X)-group; $R^{45}$ represents a hydrogen atom, perfluoroallyl group, cyano group, oxycarbonyl group, carbamoyl group, sulfonyl group, sulfamoyl group, or R(C=X)-group; R represents an aliphatic hydrocarbon group, aryl group, or heterocyclic group, X represents an oxygen atom, sulfur atom, N—$R^{A1}$, or $CR^{A2}R^{A3}$, $R^{A1}$, $R^{A2}$ and $R^{A3}$ each independently represents a hydrogen atom or substituent; $R^{46}$, $R^{47}$, and $R^{48}$ each independently represents a hydrogen atom or substituent; these $R^{44}$, $R^{45}$, $R^{46}$, $R^{47}$, and $R^{48}$ have the same definitions as $R^{24}$, $R^{25}$, $R^{26}$, $R^{27}$, and $R^{28}$ in the general formula (II), respectively; m represents 0, 1, or 2; n represents an integer which is 2 or more; two or more combinations of $Ar^{41}$, $R^{42}$, $R^{44}$, $R^{46}$, $R^{47}$, $R^{48}$, and m may be the same or different; L represents a linkage group having an n valence; and at least two of the $Ar^{41}$, $R^{42}$, and L each independently represents an aryl group or heterocyclic group.

Preferably, L, which is a linkage group having an n valence, is a group consisting of a combination of an oxygen atom, nitrogen atom, sulfur atom, methylene group, vinyl group, acetylene group, phenyl group, aniline group, or heterocyclic group. L may be substituted and may form a fused ring. Here, as a heterocycle, a heterocycle composed of 1 to 20 carbons is preferable, and a heterocycle composed of 1 to 12 carbons is more preferable. Examples of a hetero atom which forms the heterocycle include a nitrogen atom, oxygen atom, sulfur atom, and selenium atom. Specific examples thereof include pyrolidine, piperidine, piperazine, morpholine, thiophene, selenophene, furan, pyrrole, imidazole, pyrazole, pyridine, pyrazine, pyridazine, triazole, triazine, indole, indazole, purine, thiazoline, thiazole, thiadiazole, oxazoline, oxazole, oxadiazole, quinoline, isoquinoline, phthalazine, naphthyridine, quinoxaline, quinazoline, cinnoline, pteridine, acridinephenanthroline, phenazine, tetrazole, benzimidazole, benzoxazole, benzothiazole, benzotriazole, tetrazaindene, and the like. Further, examples of the substituents thereof have the same definition as those described as the substituents for $R^1$, $R^2$, and $R^3$.

More preferably, as the linkage group having a valence of n, L, a group consisting of a combination of an oxygen atom, nitrogen atom, sulfur atom, methylene group, vinyl group, acetylene group, aniline, phenylene, thiophene, pyrrole, furan, selenophene, imidazole, pyrazole, pyridine, pyrazine, pyridazine, triazole, triazine, indole, indazole, purine, thiazoline, thiazole, thiadiazole, oxazoline, oxazole, or oxadiazole are further preferable, and the groups in the combination may form a fused ring.

It is particularly preferable that the linkage group having a valence of n, L, comprises one, or two or more of the aniline, phenylene, thiophene, pyrrole, furan, selenophene, naphthalene, anthracene, pyridine, pyridazine, pirimidine, azulene, carbazole, allylenevinylene, allyleneethynylene, allylenephenylene, and triarylamine (as examples of an allylene group or aryl group, phenylene, thiophene, pyrrole, furan, selenophene, imidazole, pyrazole, pyridine, pyrazine, pyridazine, triazole, triazine, indole, indazole, purine, thiazoline, thiazole, thiadiazole, oxazoline, oxazole, and oxadiazole are represented). Among these linkage groups, a linkage group having 1 to 20 of those described above is preferable, one having 1 to 10 of those described above is more preferable, and one having 1 to 5 of those described above is particularly preferable. These linkage group may have an oxygen atom, nitrogen atom, sulfur atom, or methylene group.

For example, specific examples of the linkage group having a valance of n, L, are the following.

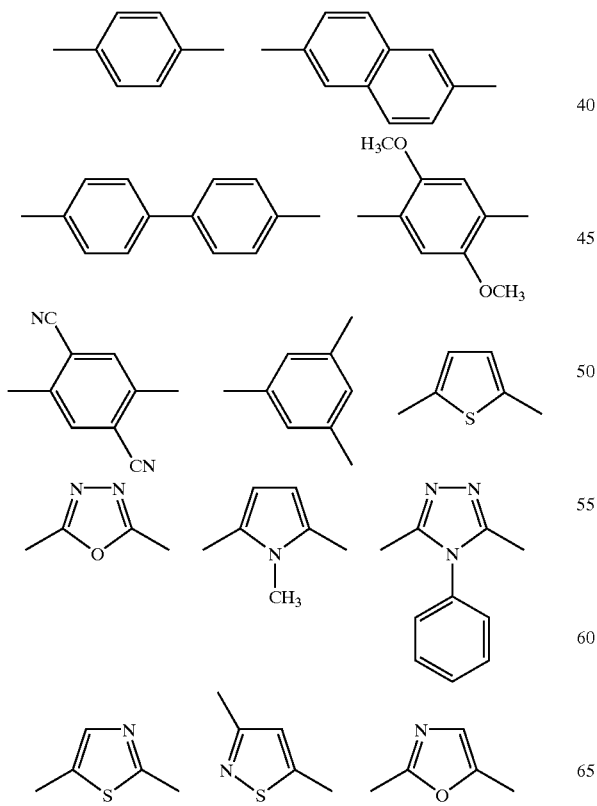

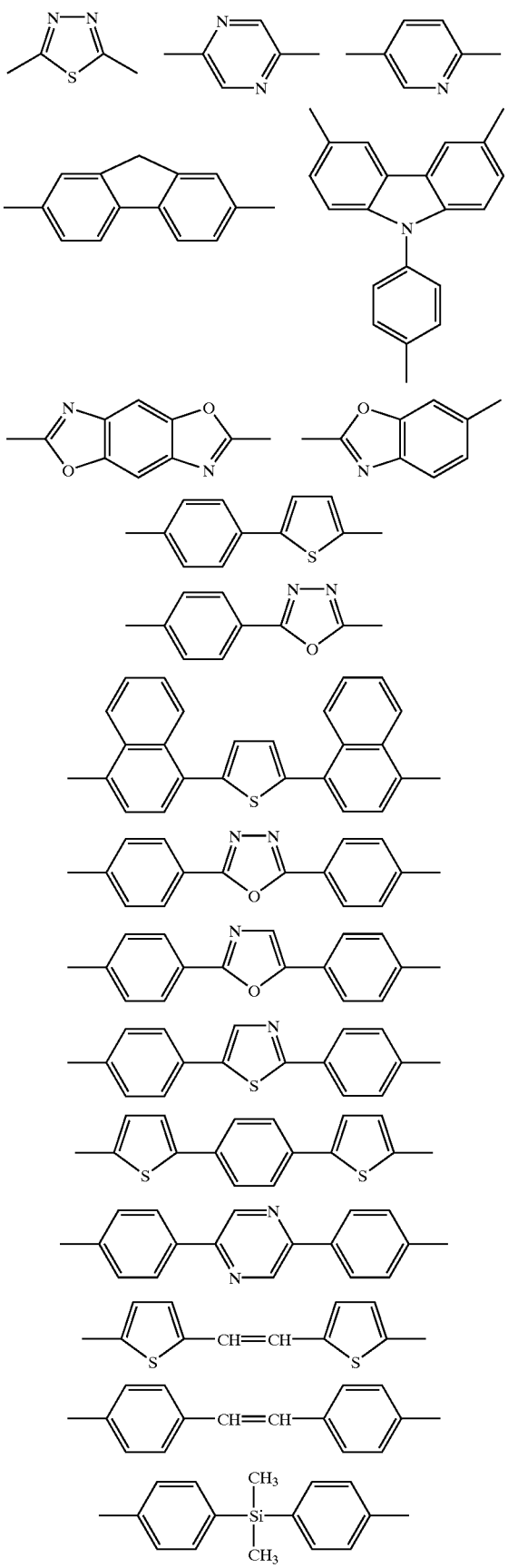

-continued

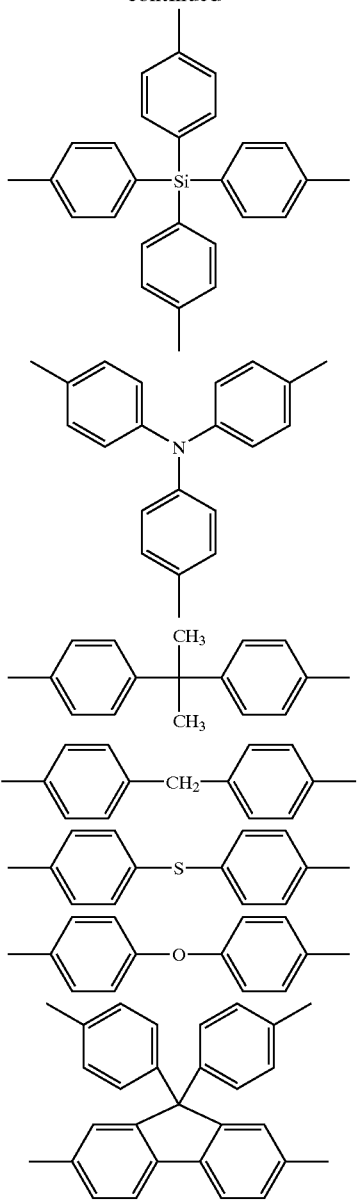

With regards to the compound expressed by the general formula (IV), preferable combinations of $Ar^{41}$, $R^{42}$, and $R^{44}$–$R^{48}$ will be explained.

In the general formula (IV), two or more $Ar^{41}$s which exist may be the same or different. Preferably, $Ar^{41}$ is an aryl group with a single ring or two rings and having 6 to 30 carbons (for example, a phenyl, naphthyl, and the like), or aromatic heterocyclic group having 5 to 6 members which contains a nitrogen atom, oxygen atom, or sulfur atom. Preferably, $R^{42}$ is an aryl group with a single ring or two to four rings having 6 to 30 carbons (for example, a phenyl, naphthyl, anthryl, phenanthryl, pyrenyl, indenyl, and the like); aromatic heterocyclic group having 5 to 6 members which contains a nitrogen atom, oxygen atom, or sulfur atom; or alkyl group, alkenyl group or alkynyl group having 1 to 20 carbons. $Ar^{41}$ and $R^{42}$ may have substituents, and preferable examples of such substituents include an alkyl group, alkoxy group, alkylthio group, acyl group, and substituted amino group (as examples of its substituent, an alkyl group, alkenyl group, alkynyl group, aryl group, and het-erocyclic group can be listed). $R^{46}$, $R^{47}$ and $R^{48}$ represent a hydrogen atom or substituent, respectively. Preferable examples of the substituent include an alkyl group, alkoxy group, alkylthio group, alkenyl group, acyl group, sulfonyl group, alkoxycarbonyl group, carbonamide group, or cyano group.

Examples of preferable combinations of $R^{44}$ and $R^{45}$ are the same as those of $R^{24}$ and $R^{25}$ in the general formula (I). Preferably, the linkage group having a valence of n, L, contains one, or two or more of the aniline, phenylene, thiophene, pyrrole, furan, selenophene, naphthalene, anthracene, pyridine, pyridazine, pirimidine, azulene, carbazole, allylenevinylene, allyleneethynylene, allylenephenylene, and triarylamine (as examples of the allylene group or aryl group, phenylene, thiophene, pyrrole, furan, selenophene, imidazole, pyrazole, pyridine, pyrazine, pyridazine, triazole, triazine, indole, indazole, purine, thiazoline, thiazole, thiadiazole, oxazoline, oxazole, and oxadiazole can be listed). Among these, a linkage group having 1 to 20 of those described above is preferable, and these linkage groups may have an oxygen atom, nitrogen atom, sulfur atom, or methylene group.

An aspect of the compound expressed by the general formula (IV) which is further preferable is a compound expressed by general formula (VI) which will be described later.

⑤ Compound Expressed by General Formula (V):

General formula (V)

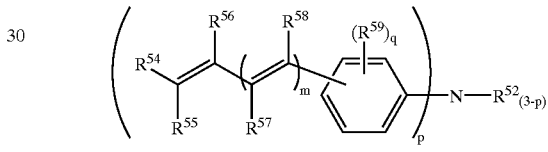

wherein, in the general formula (V), $R^{52}$ represents an aryl group, heterocyclic group, or aliphatic hydrocarbon group having the same respective definitions and preferable ranges as the aryl group, heterocyclic group, and aliphatic hydrocarbon group which were described with regards to $R^1$, $R^2$, and $R^3$ in the general formula (A); $R^{54}$ represents a heterocyclic group, perfluoroalkyl group, cyano group, oxycarbonyl group, carbamoyl group, sulfonyl group, sulfamoyl group, or R(C=X)-group; $R^{55}$ represents a hydrogen atom, perfluoroalkyl group, cyano group, oxycarbonyl group, carbamoyl group, sulfonyl group, sulfamoyl group, or R(C=X)-group; R represents an aliphatic hydrocarbon group, aryl group, or heterocyclic group, X represents an oxygen atom, sulfur atom, N—$R^{A1}$, or $CR^{A2}R^{A3}$, $R^{A1}$, $R^{A2}$, and $R^{A3}$ each independently represents a hydrogen atom or substituent; $R^{56}$, $R^{57}$, and $R^{58}$ each independently represents a hydrogen atom or substituent; these $R^{54}$, $R^{55}$, $R^{56}$, $R^{57}$, and $R^{58}$ have the same definition as $R^{24}$, $R^{25}$, $R^{26}$, $R^{27}$, and $R^{28}$ in the general formula (II), respectively; $R^{59}$ represents a substituent having the same definition as the substituents for $R^1$, $R^2$, and $R^3$ in the general formula (A); q represents an integer which is of from 0 to 4; when q is 2, 3, or 4, two or more $R^{59}$s may be the same or different; m represents 0, 1, or 2; p represents 1, 2, or 3; when p is 2 or 3, two or more combinations of $R^{52}$, $R^{54}$, $R^{55}$, $R^{56}$, $R^{57}$, $R^{58}$, $R^{59}$, m, and q may be the same or different; and, on the other hand, when p is 1, two $R^{52}$s may be the same or different, however, at least one of the two $R^{52}$s represents an aryl group or heterocyclic group, and $R^{54}$ and $R^{55}$ are not cyano groups at the same time. When $R^{55}$ is a hydrogen atom, $R^{54}$ represents a heterocyclic group which has aromatic rings and is formed from 3 to 7 rings.

With regards to the compound expressed by the general formula (V), preferable combinations of $R^{52}$, and $R^{54}$–$R^{59}$ will be described.

Preferably, $R^{52}$ is an aryl group with a single ring or two to four rings and having 6 to 30 carbons (for example, a phenyl, naphthyl, anthryl, phenanthryl, pyrenyl, indenyl, and the like); aromatic heterocyclic group having 5 to 6 members which contains a nitrogen atom, oxygen atom, or sulfur atom; or alkyl group, alkenyl group, or alkynyl group having 1 to 20 carbons. $R^{52}$ may have a substituent, and preferable examples of a substituent for $R^{52}$ and of $R^{59}$ include an alkyl group, alkoxy group, alkylthio group, acyl group, or a substituted amino group (as examples of its substituent, an alkyl group, alkenyl group, alkynyl group, aryl group, and a heterocyclic group can be listed), respectively. $R^{56}$, $R^{57}$ and $R^{58}$ each independently represents a hydrogen atom or substituent, and preferable examples of the substituent include an alkyl group, alkoxy group, alkylthio group, alkenyl group, acyl group, sulfonyl group, alkoxycarbonyl group, carbonamide group, and cyano group.

Preferable combinations of $R^{54}$ and $R^{55}$ are the same as the preferable combinations of $R^{24}$ and $R^{25}$ in the general formula (I).

An aspect of the compound expressed by the general formula (V) which is further preferable is a compound expressed by general formula (VII) which will be described later.

⑥ Compound Expressed by General Formula (VI):

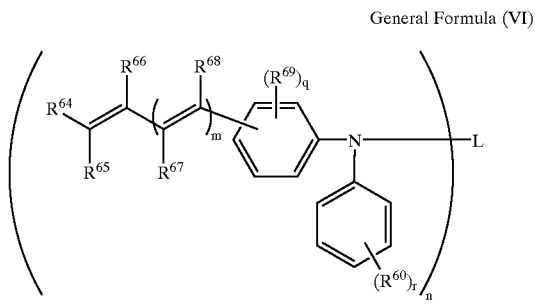

General Formula (VI)

wherein, in the general formula (VI), $R^{64}$ represents a heterocyclic group, perfluoroalkyl group, cyano group, oxycarbonyl group, carbamoyl group, sulfonyl group, sulfamoyl group, or R(C=X)-group; $R^{65}$ represents a hydrogen atom, perfluoroalkyl group, cyano group, oxycarbonyl group, carbamoyl group, sulfonyl group, sulfamoyl group, or R(C=X)-group; R represents an aliphatic hydrocarbon group, aryl group, or heterocyclic group, X represents an oxygen atom, sulfur atom, N—$R^{A1}$, or $CR^{A2}R^{A3}$; $R^{A1}$, $R^{A2}$, and $R^{A3}$ each independently represents a hydrogen atom or substituent; $R^{66}$, $R^{67}$, and $R^{68}$ each independently represents a hydrogen atom or substituent; these $R^{64}$, $R^{65}$, $R^{66}$, $R^{67}$, and $R^{68}$ have the same definition as $R^{24}$, $R^{25}$, $R^{26}$, $R^{27}$, and $R^{28}$ in the general formula (II), respectively; $R^{69}$ and $R^{60}$ each independently represents substituents, and such substituents have the same definition as the substituents for $R^1$, $R^2$, and $R^3$ in the general formula (A); q represents an integer which is of from 0 to 4, and r represents an integer which is of from 0 to 5; when q is 2, 3, or 4, and r represents 2, 3, 4, or 5, two or more $R^{69}$s and two or more $R^{60}$s may be the same or different, respectively; m represents 0, 1, or 2; n represents an integer which is 2 or greater; two or more combinations of $R^{60}$, $R^{64}$, $R^{65}$, $R^{66}$, $R^{67}$, $R^{68}$, $R^{69}$, m, q, and r may be the same or different; and L represents a linkage group having a valence of n has the same definition as the linkage group having a valence of n in the general formula (IV), and preferable examples thereof are also the same as those of the linkage group having a valence of n in the general formula (IV).

With regards to the compound expressed by the general formula (VI), preferable combinations of $R^{60}$, and $R^{64}$–$R^{69}$ will be described.

$R^{66}$, $R^{67}$, and $R^{68}$ each independently represents a hydrogen atom or substituent, and preferable examples of the substituent include an alkyl group, alkoxy group, alkylthio group, alkenyl group, acyl group, sulfonyl group, alkoxycarbonyl group, carbonamide group, and a cyano group. Preferable combinations of $R^{64}$ and $R^{65}$ are the same as the preferable combinations of $R^{24}$ and $R^{25}$ in the general formula (I).

Preferably, $R^{60}$ and $R^{69}$ each independently represents an alkyl group, alkoxy group, alkylthio group, acyl group, or substituted amino group (as examples of its substituent, an alkyl group, alkenyl group, alkynyl group, aryl group, and heterocyclic group can be listed). Preferably, the linkage group having a valence of n, L, contains one, or two or more of the aniline, phenylene, thiophene, pyrrole, furan, selenophene, naphthalene, anthracene, pyridine, pyridazine, pirimidine, azulene, carbazole, allylenevinylene, allyleneethynylene, allylenephenylene, and triarylamine (as examples of the allylene group or aryl group, phenylene, thiophene, pyrrole, furan, selenophene, imidazole, pyrazole, pyridine, pyrazine, pyridazine, triazole, triazine, indole, indazole, purine, thiazoline, thiazole, thiadiazole, oxazoline, oxazole, and oxadiazole can be listed). Among these, a linkage group having 1 to 20 of those described above is preferable, and these linkage groups may have an oxygen atom, nitrogen atom, sulfur atom, or methylene group.

An aspect of the compound expressed by the general formula (VI) which is further preferable is a compound expressed by the general formula (VIII) which will be described later.

⑦ Compounds Expressed by General Formula (VII)

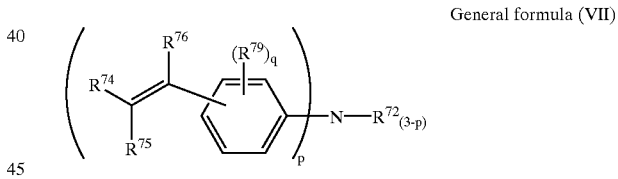

General formula (VII)

wherein, in the general formula (VII), $R^{72}$ represents an aryl group, heterocyclic group, or aliphatic hydrocarbon group having the same respective definitions and preferable ranges as the aryl group, heterocyclic group, and aliphatic hydrocarbon group which were described with regards to $R^1$, $R^2$, and $R^3$ in the general formula (I); $R^{74}$ represents a heterocyclic group, perfluoroalkyl group, cyano group, oxycarbonyl group, carbamoyl group, sulfonyl group, sulfamoyl group, or R(C=X)-group; $R^{75}$ represents a hydrogen atom, perfluoroalkyl group, cyano group, oxycarbonyl group, carbamoyl group, sulfonyl group, sulfamoyl group, or R(C=X)-group; R represents an aliphatic hydrocarbon group, aryl group, or heterocyclic group; X represents an oxygen atom, sulfur atom, N—$R^{A1}$, or $CR^{A2}R^{A3}$; $R^{A1}$, $R^{A2}$, and $R^{A3}$ each independently represents a hydrogen atom or substituent; these $R^{74}$, $R^{75}$, and $R^{76}$ have the same definitions as $R^4$, $R^5$, and $R^6$ in the general formula (II), respectively; $R^{79}$ represents a substituent having the same definition as the substituents for $R^1$, $R^2$, and $R^3$ in the general formula (A), respectively; q represents an integer which is of from 0 to 4; when q is 2, 3, or 4, two or more $R^{79}$ may be the same or different; p represents 1, 2, or 3; when p is 2 or 3, two or more combinations of $R^{72}$, $R^{74}$, $R^{75}$, $R^{76}$, $R^{79}$, and q may be the same or may be different; and, on the other hand, when p is 1, two $R^{72}$s may be the same or different, however, at least one of the two $R^{72}$s represents an aryl group or heterocyclic-group, and $R^{74}$ and $R^{75}$ are not cyano groups at the same time; and when $R^{75}$ is a hydrogen atom, $R^{74}$ represents a heterocyclic group which has aromatic rings and is formed from 3 to 7 rings.

With regards to the compound expressed by the general formula (VII), preferable combinations of $R^{72}$, $R^{74}$–$R^{76}$, and $R^{79}$ will be explained.

Preferably, $R^{72}$ is an aryl group with a single ring or two to four rings and having 6 to 30 carbons (for example, a phenyl, naphthyl, anthryl, phenanthryl, pyrenyl, indenyl, and the like); aromatic heterocyclic group having 5 to 6 members which contains a nitrogen atom, oxygen atom, or sulfur atom; or alkyl group, alkenyl group, or alkynyl group, each having 1 to 20 carbons. $R^{72}$ may have a substituent, and preferable examples of the substituent for $R^{72}$ and preferable examples of $R^{79}$ include an alkyl group, alkoxy group, alkylthio group, acyl group, or substituted amino group (as examples of its substituent, an alkyl group, alkenyl group, allynyl group, aryl group, and heterocyclic group can be listed), respectively. $R^{76}$ represents a hydrogen atom or substituent and preferable examples of the substituent include an alkyl group, alkoxy group, alkylthio group, alkenyl group, acyl group, sulfonyl group, alkoxycarbonyl group, carbonamide group, or cyano group.

Preferable combinations of $R^{74}$ and $R^{75}$ are the same as the preferable combinations of $R^{24}$ and $R^{25}$ in the general formula (I).

⑧ Compounds Expressed by General Formula (VIII):

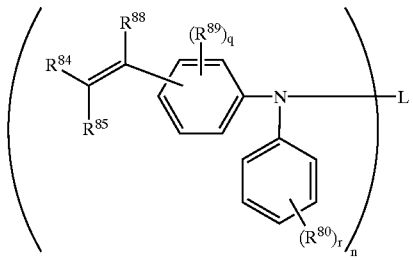

General Formula (VIII)

wherein, in the general formula (VIII), $R^{84}$ represents a heterocyclic group, perfluoroalkyl group, cyano group, oxycarbonyl group, carbamoyl group, sulfonyl group, sulfamoyl group, or R(C=X)-group; $R^{85}$ represents a hydrogen atom, perfluoroalkyl group, cyano group, oxycarbonyl group, carbamoyl group, sulfonyl group, sulfamoyl group, or R(C=X)-group; R represents an aliphatic hydrocarbon group, aryl group, or heterocyclic group; X represents an oxygen atom, sulfur atom, N—$R^{A1}$, or $CR^{A2}R^{A3}$; $R^{A1}$, $R^{A2}$, and $R^{A3}$ each independently represents a hydrogen atom or substituent; $R^{86}$ represents a hydrogen atom or substituent; these $R^{84}$, $R^{85}$ and $R^{86}$ have the same definition as $R^4$, $R^5$, and $R^6$ in the general formula (II), respectively; $R^{89}$ and $R^{80}$ represent substituents, and such substituents have the same definition as the substituents for $R^1$, $R^2$, and $R^3$ in the general formula (A); q represents an integer which is of from 0 to 4, and r represents an integer which is of from 0 to 5; however, when q is 2, 3, or 4, and r is 2, 3, 4, or 5, two or more $R^{89}$s and two or more $R^{80}$s may be the same or different, respectively; n represents an integer which is 2 or greater than 2, and two or more combinations of $R^{80}$, $R^{84}$, $R^{85}$, $R^{86}$, $R^{89}$, q, and r may be the same or different; and, L represents a linkage group having a valence of n and has the same definition as the linkage group having a valence of n in the general formula (IV), and preferable examples thereof are the same as those of the linkage group having the valence of n in the general formula (IV).

With regards to the compound expressed by the general formula (VIII), preferable combinations of $R^{80}$, $R^{84}$–$R^{86}$, and $R^{89}$ will be explained.

$R^{86}$ represents a hydrogen atom or substituent and preferable examples of the substituent include an alkyl group, alkoxy group, alkylthio group, alkenyl group, acyl group, sulfonyl group, alkoxycarbonyl group, carbonamide group, and cyano group.

Preferable combinations of $R^{84}$ and $R^{85}$ are the same as the Preferable combinations of $R^{24}$ and $R^{25}$ in the general formula (I).

Preferably, $R^{80}$ and $R^{89}$ each independently represent an alkyl group, alkoxy group, alkylthio group, acyl group, or substituted amino group (as examples of its substituent, an alkyl group, alkenyl group, alkynyl group, aryl group, and heterocyclic group can be listed). Preferably, the linkage group having a valence of n, L, contains one, or two or more of the aniline group, phenylene group, thiophene group, pyrrole group, furan group, selenophene group, naphthalene group, anthracene group, pyridine group, pyridazine group, pirimidine group, azulene group, carbazole group, allylenevinylene group, allyleneethynylene group, allylenephenylene group, and triarylamine group (as examples of the allylene group or aryl group, phenylene group, thiophene group, pyrrole group, furan group, selenophene group, imidazole group, pyrazole group, pyridine group, pyrazine group, pyridazine group, triazole group, triazine group, indole group, indazole group, purine group, thiazoline group, thiazole group, thiadiazole group, oxazoline group, oxazole group, and an oxadiazole group can be listed). Among these, a linkage group having 1 to 20 of the aforementioned groups is preferable, and these linkage groups may have an oxygen atom, nitrogen atom, sulfur atom, or methylene group.

⑨ Compounds Expressed by General Formula (IX):

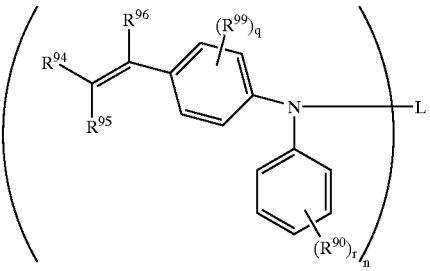

General formula (IX)

With regards to the compound expressed by the general formula (I), preferable combinations of $R^{90}$, $R^{94}$–$R^{96}$, and $R^{99}$ will be explained.

A preferable combination of $R^{90}$, $R^{94}$–$R^{96}$, and $R^{99}$ is a combination in which $R^{96}$ represents a hydrogen group, alkyl group having 1 to 20 carbons, alkenyl group having 1 to 20 carbons, acyl group having 1 to 20 carbons, sulfonyl group having 1 to 20 carbons, alkoxycarbonyl group having 1 to 20 carbons, carbonamido group having 1 to 20 carbons, or cyano group, and $R^{90}$ and $R^{99}$ are a hydrogen atom, alkyl group having 1 to 20 carbons, alkoxy group having 1 to 20 carbons, or substituted amino group having 1 to 20 carbons (as examples of its substituent, an alkyl group, alkenyl group, alkynyl group, aryl group, and heterocyclic group can be listed), respectively.

Preferable combinations of $R^{94}$ and $R^{95}$ include a combination in which, when $R^{94}$ represents a heterocyclic group, $R^{95}$ represents a hydrogen atom, perfluoroalkyl group having 1 to 20 carbons, cyano group, oxycarbonyl group having 2 to 20 carbons, carbamoyl group having 2 to 20 carbons, sulfonyl group having 1 to 20 carbons, sulfamoyl group having 1 to 20 carbons, or R(C=X)-group having 2 to 20 carbons; and, a combination in which, when $R^{94}$ represents a perfluoroalkyl group having 1 to 20 carbons, oxycarbonyl group having 2 to 20 carbons, carbamoyl group having 2 to 20 carbons, sulfonyl group having 1 to 20 carbons, sulfamoyl group having 1 to 20 carbons, or R(C=X)-group having 2 to 20 carbons, $R^{95}$ represents a perfluoroalkyl group having 1 to 20 carbons, cyano group, oxycarbonyl group having 2 to 20 carbons, carbamoyl group having 2 to 20 carbons, sulfonyl group having 1 to 20 carbons, sulfamoyl group having 1 to 20 carbons, or R(C=X)-group having 2 to 20 carbons.

Preferably, the linkage group having a valence of n, L, contains one, or two or more of the aniline group, phenylene group, thiophene group, pyrrole group, furan group, selenophene group, naphthalene group, anthracene group, pyridine group, pyridazine group, pirimidine group, azulene group, carbazole group, allylenevinylene group, allyleneethynylene group, allylenephenylene group, and triarylamine group (as examples of the allylene group or aryl group, phenylene group, thiophene group, pyrrole group, furan group, selenophene group, imidazole group, pyrazole group, pyridine group, pyrazine group, pyridazine group, triazole group, triazine group, indole group, indazole group, purine group, thiazoline group, thiazole group, thiadiazole group, oxazoline group, oxazole group, and oxadiazole group can be listed). Among these, a linkage group having 1 to 20 of the aforementioned groups is preferable, and these linkage groups may have an oxygen atom, nitrogen atom, sulfur atom, or methylene group.

More preferable combinations of $R^{90}$, $R^{94}$–$R^{96}$, and $R^{99}$ include a combination in which, $R^{96}$ represents a hydrogen atom, alkenyl group having 1 to 20 carbons, acyl group having 1 to 20 carbons, sulfonyl group having 1 to 20 carbons, alkoxycarbonyl group having 1 to 20 carbons, carbonamido group having 1 to 20 carbons, or cyano group, and $R^{90}$ and $R^{99}$ each independently represents a hydrogen atom, alkyl group having 1 to 20 carbons, alkoxy group having 1 to 20 carbons, or substituted amino group having 1 to 20 carbons (as examples of its substituent, an alkyl group, alkenyl group, alkynyl group, aryl group, land heterocyclic group can be listed). Further, examples of even more preferable combinations of $R^{94}$ and $R^{95}$ include a combination in which, when $R^{94}$ represents a heterocyclic group, $R^{95}$ represents a perfluoroalkyl group having 1 to 20 carbons, cyano group, oxycarbonyl group having 2 to 20 carbons, carbamoyl group having 2 to 20 carbons, sulfonyl group having 1 to 20 carbons, sulfamoyl group having 1 to 20 carbons, or R(C=X)-group having 2 to 20 carbons; and a combination in which, when $R^{94}$ represents a oxycarbonyl group having 2 to 20 carbons, sulfonyl group having 2 to 20 carbons, or acyl group having 2 to 20 carbons, $R^{95}$ represents a perfluoroalkyl group having 1 to 20 carbons, cyano group, oxycarbonyl group having 2 to 20 carbons, carbamoyl group having 2 to 20 carbons, sulfonyl group having 1 to 20 carbons, sulfamoyl group having 1 to 20 carbons, or acyl group having 2 to 20 carbons (X in R(C=X)-group is an oxygen atom). Preferably, the linkage group having a valence of n, L, contains one, or two or more of the aniline group, phenylene group, thiophene group, pyrrole group, furan group, selenophene group, naphthalene group, anthracene group, pyridine group, pyridazine group, pirimidine group, azulene group, carbazole group, allylenevinylene group, allyleneethynylene group, allylenephenylene group, and triarylamine group (as examples of the allylene group or aryl group, a phenylene group, thiophene group, pyrrole group, furan group, selenophene group, imidazole group, pyrazole group, pyridine group, pyrazine group, pyridazine group, triazole group, triazine group, indole group, indazole group, purine group, thiazoline group, thiazole group, thiadiazole group, oxazoline group, oxazole group, and oxadiazole group can be listed). Among these, a linkage group having 1 to 20 of the aforementioned groups is preferable, and these linkage groups may have an oxygen atom, nitrogen atom, sulfur atom, or methylene group.

A combination of $R^{90}$, $R^{94}$–$R^{96}$, and $R^{99}$ which is particularly preferable is a combination in which, $R^{96}$ represents a hydrogen atom, alkenyl group having 1 to 10 carbons, acyl group having 1 to 10 carbons, sulfonyl group having 1 to 10 carbons, alkoxycarbonyl group having 1 to 10 carbons, carbonamido group having 1 to 10 carbons, or cyano group, and $R^{90}$ and $R^{99}$ each independently represents a hydrogen atom, alkyl group having 1 to 10 carbons, alkoxy group having 1 to 10 carbons, or substituted amino group having 1 to 20 carbons (as examples of its substituents, an alkyl group, alkenyl group, alkynyl group, aryl group, thiophene group, pyrrole group, furan group, selenophene group, naphthalene group, anthracene group, pyridine group, pyridazine group, pirimidine group, azulene group, and carbazole group can be listed). Combinations of $R^{94}$ and $R^{95}$ which are particularly preferable include: a combination in which, when $R^{94}$ represents a heterocyclic group of a thiophene group, furan group, pyrrole group, imidazole group, pyrazole group, pyridine group, pyrazine group, pyridazine group, triazole group, triazine group, indole group, indazole group, thiazoline group, thiazole group, thiadiazole group, oxazoline group, oxazole group, oxadiazole group, quinoline group, benzimidazole group, benzoxazole group, benzothiazole group, or benzotriazole group, $R^{95}$ represents a perfluoroalkyl group having 1 to 20 carbons, cyano group, oxycarbonyl group having 2 to 20 carbons, carbamoyl group having 2 to 20 carbons, sulfonyl group having 1 to 20 carbons, sulfamoyl group having 1 to 20 carbons, or acyl group having 2 to 20 carbons (X in R(C=X)-group is an oxygen atom); and a combination in which, when $R^{94}$ represents a perfluoroalkyl group having 1 to 20 carbons, alkyloxycarbonyl group having 2 to 20 carbons, sulfonyl group having 1 to 20 carbons, sulfamoyl group having 1 to 20 carbons, or acyl group having 2 to 20 carbons (X in R(C=X)-group is an oxygen atom), $R^{95}$ represents a cyano group, alkyloxycarbonyl group having 2 to 20 carbons, sulfonyl group having 1 to 20 carbons, or acyl group having 2 to 20 carbons (X in R(C=X)-group is an oxygen atom). As the acyl group for $R^{94}$, an acyl group having a heterocyclic group is the most preferable. L is a linkage group having 1 to 6 of the aniline, phenylene, thiophene, pyrrole, furan, selenophene, naphthalene, anthracene, pyridine, pyridazine, pirimidine, azulene, carbazole, allylenevinylene, allyleneethynylene, allylenephenylene, and triarylamine (as examples of the allylene group or aryl group, a phenylene, thiophene, pyrrole, furan, selenophene, imidazole, pyrazole, pyridine, pyrazine, pyridazine, triazole, triazine, indole, indazole, purine, thiazoline, thiazole, thiadiazole, oxazoline, oxazole, and oxadiazole can be listed), and may have an oxygen atom, nitrogen atom, sulfur atom, or methylene group.

The compounds expressed by the general formula (A), the general formula (I), and the general formulas (III)–(IX) may be low molecular weight compounds, or may be high molecular weight compounds in which the compounds are connected to polymer principal chains as residue(s). In a case in which the compounds are high molecular compounds in such a form, their weight-average molecular weight is preferably from 1,000 to 5,000,000, and more preferably, from 10,000 to 1,000,000. Further, the compounds may be high molecular weight compounds having skeletons of the general formula (A), the general formula (I), and the general formulas (III)–(IX) for principal chains (the preferable range of their weight-average molecular weight is the same as the range described above). In a case in which the compounds are high molecular weight compounds in such a form, the compounds may be homopolymers, or may be copolymers combined with other monomers. Preferably, the compounds expressed by the general formula (A), the general formula (I), and the general formulas (III)–(IX) are low molecular weight compounds.

It should be noted that though the general formula (A), the general formula (I), and the general formulas (III)–(IX) are expressed by extreme structural formulas for convenience, they may be their tautomers.

Among the compounds represented by general formula (A), those in which $R^4$ and $R^5$ both represent electron attracting groups have particularly excellent red color purity. Further, compounds in which $R^4$ is a heterocyclic group and $R^5$ is an electron attracting group have particularly excellent light emitting efficiency. Moreover, among compounds in which $R^4$ is a heterocyclic group and $R^5$ is a hydrogen atom, those in which the heterocyclic group has 3 to 7 aromatic rings have better stability of elements than those in which the heterocyclic group has 1 or 2 aromatic rings.

Though specific examples of the compounds expressed by the general formula (I) will be listed hereinafter, the light emitting element material of the present invention is not limited to these examples.

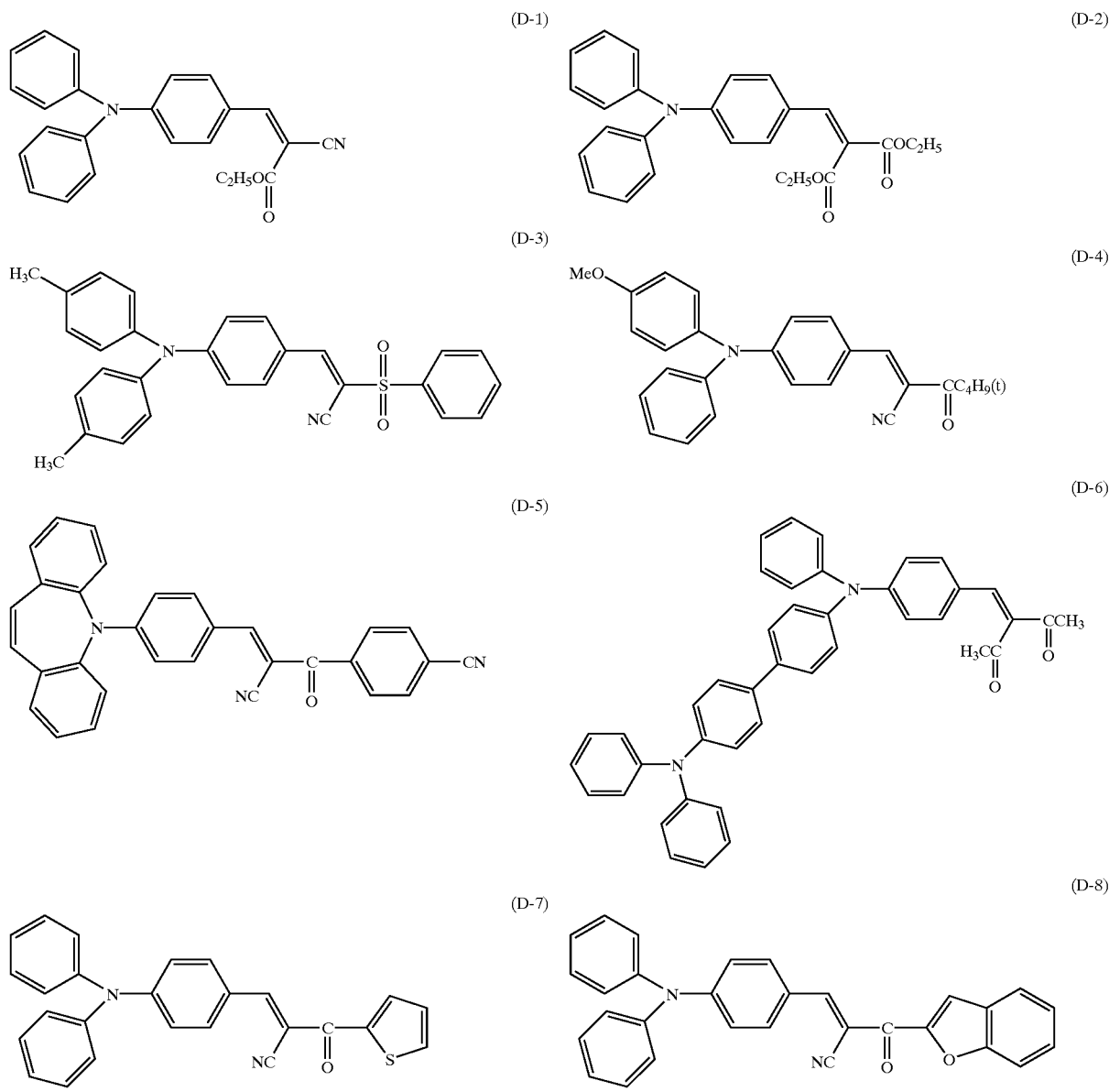

(D-9)
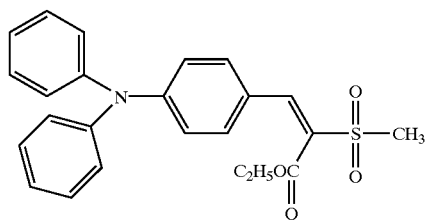
(D-10)
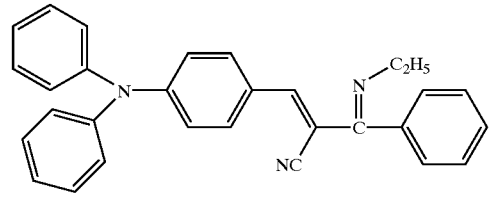
(D-11)
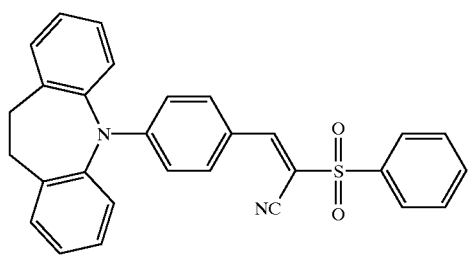
(D-12)
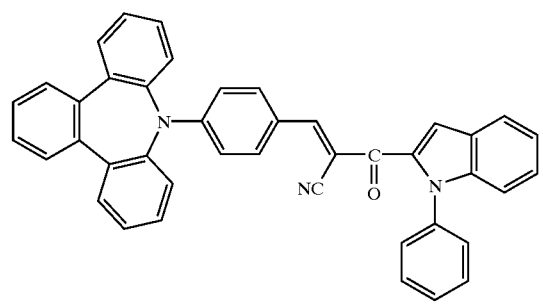
(D-13)
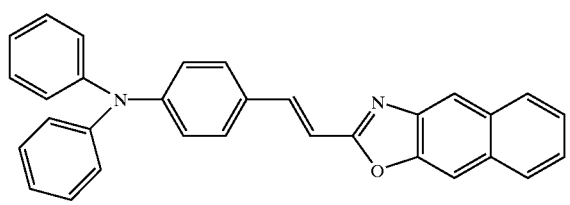
(D-14)
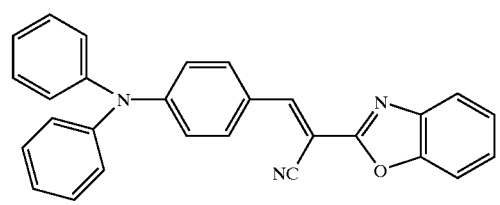
(D-15)
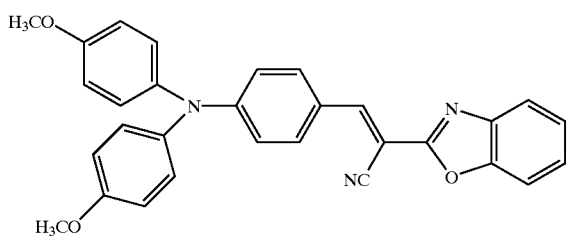
(D-16)
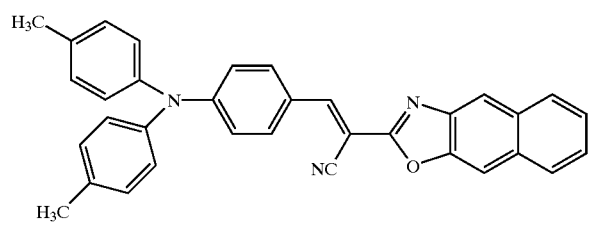
(D-17)
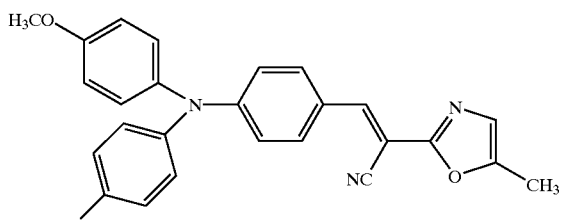
(D-18)
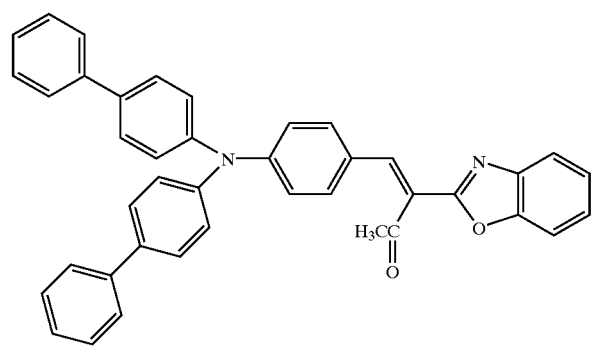

(D-20) 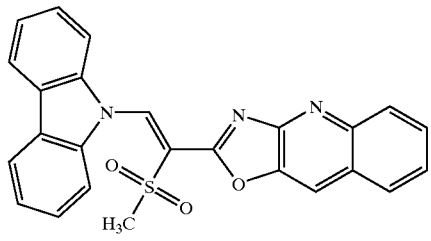
(D-21) 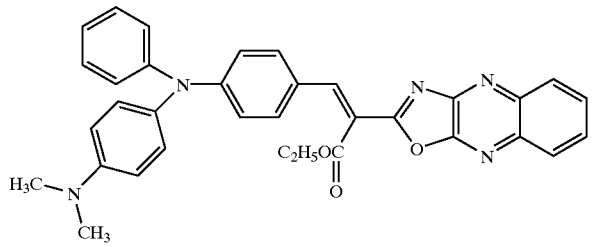
(D-22) 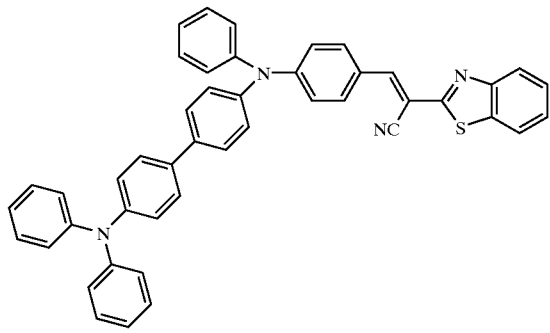
(D-23) 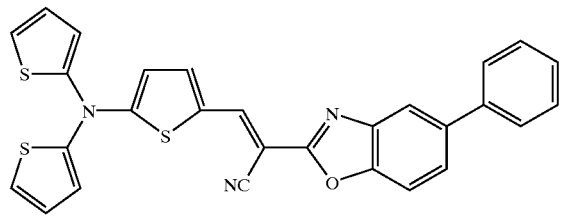
(D-24) 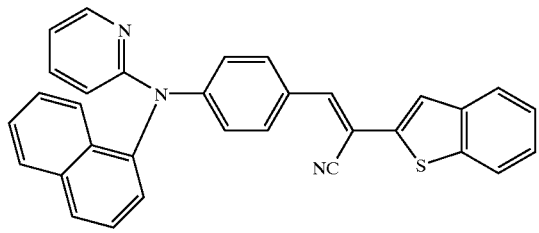
(D-25) 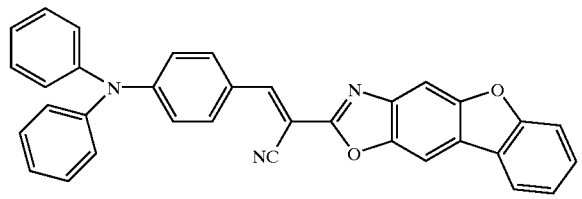
(D-26) 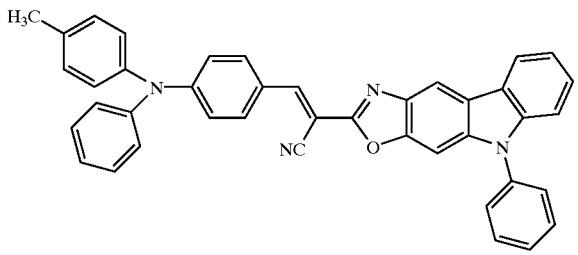
(D-27) 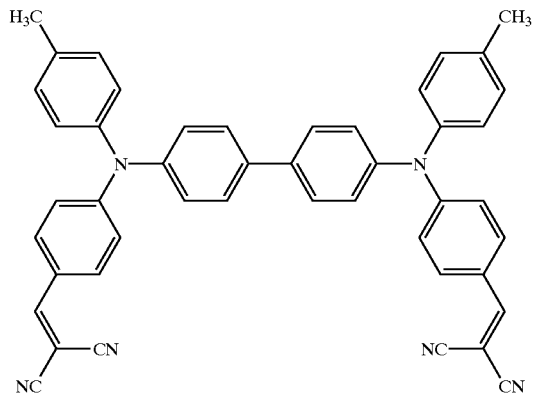

-continued
(D-28)
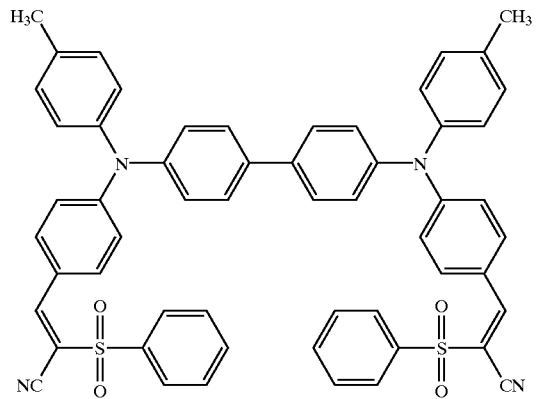
(D-29)
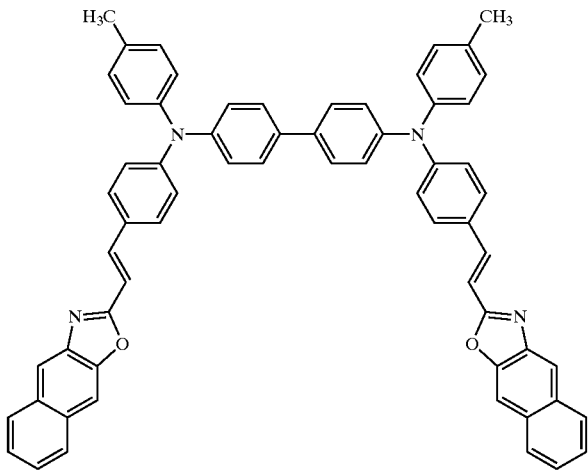
(D-30)
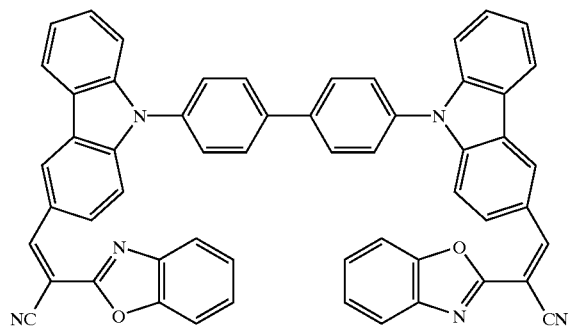
(D-31)
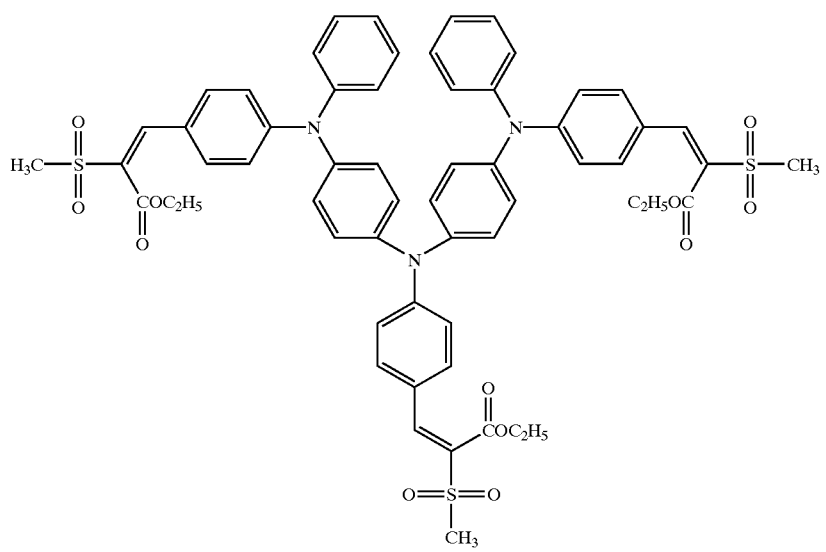

-continued
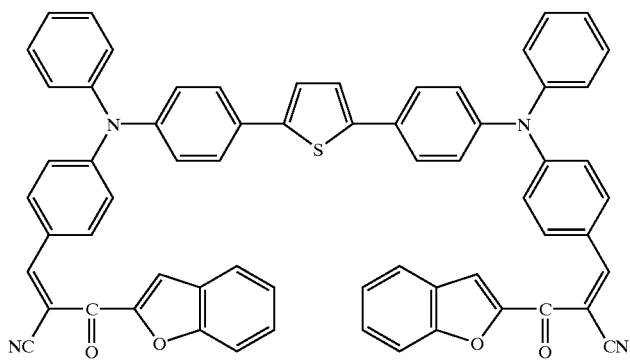
(D-32)
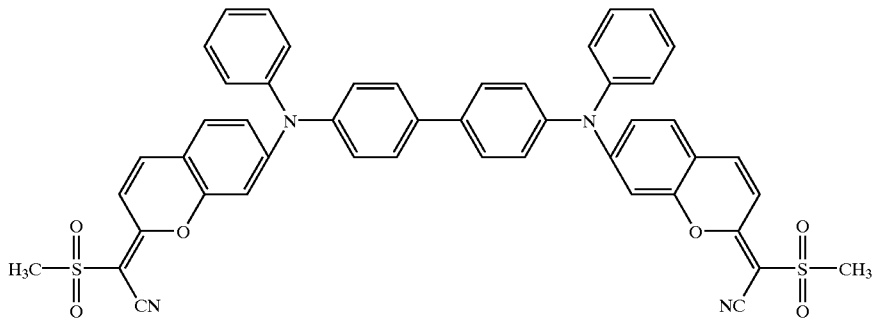
(D-33)
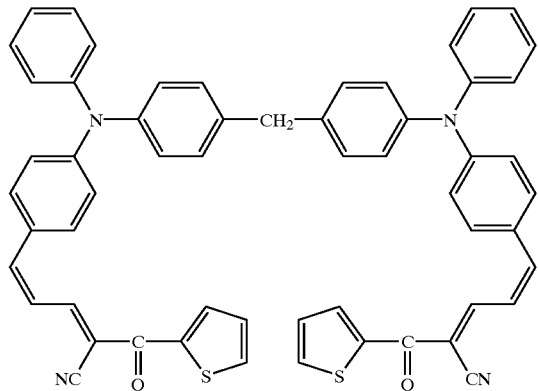
(D-34)
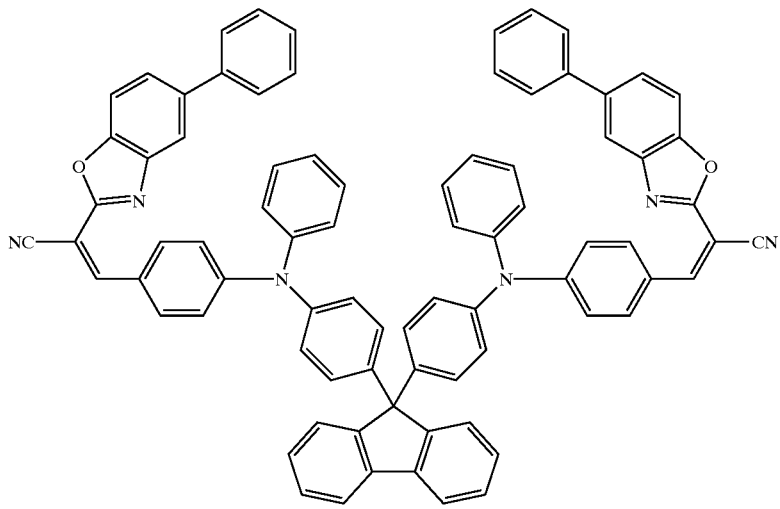
(D-35)

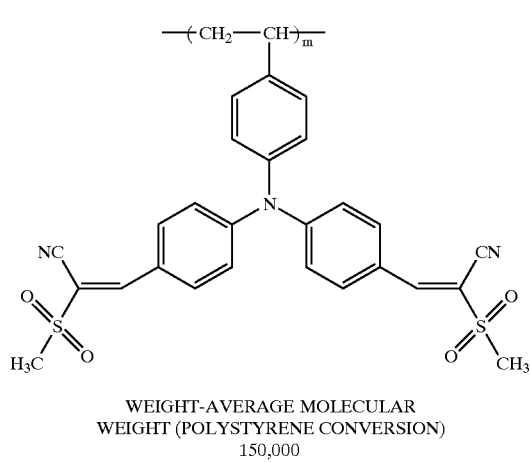
(D-36)
WEIGHT-AVERAGE MOLECULAR
WEIGHT (POLYSTYRENE CONVERSION)
150,000
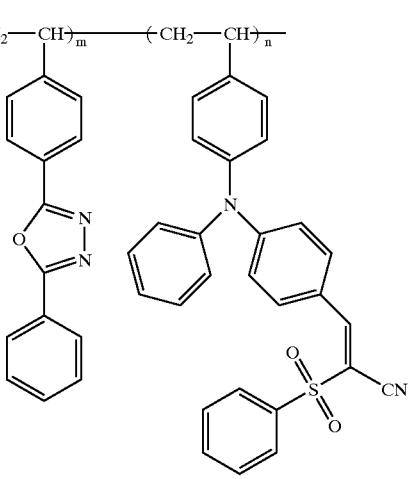
(D-37)
WEIGHT-AVERAGE MOLECULAR
WEIGHT (POLYSTYRENE CONVERSION)
100,000
m:n = 1:1 (WEIGHT RATIO)
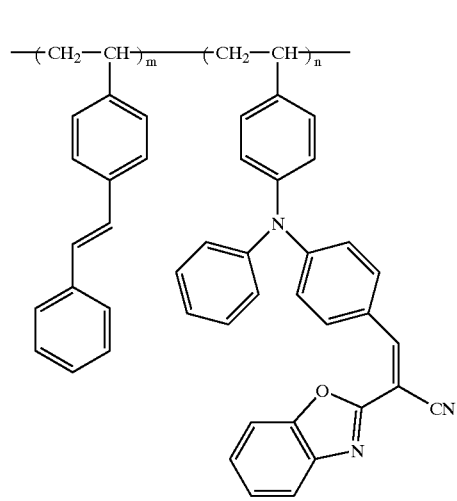
(D-38)
WEIGHT-AVERAGE MOLECULAR
WEIGHT (POLYSTYRENE CONVERSION)
110,000
m:n = 4:1 (WEIGHT RATIO)
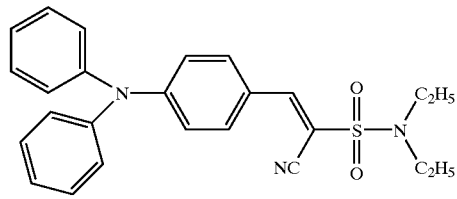
(D-39)
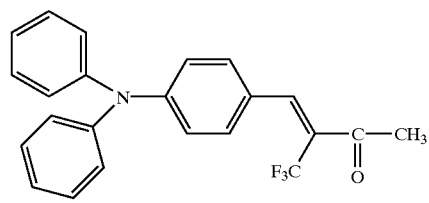
(D-40)
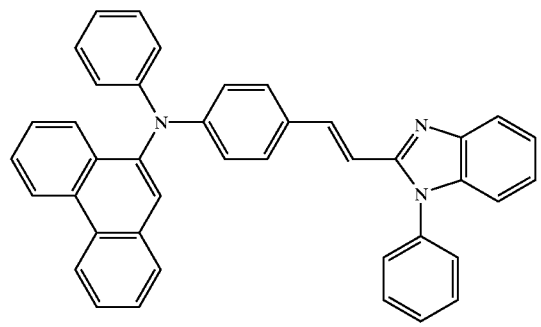
(D-41)

-continued

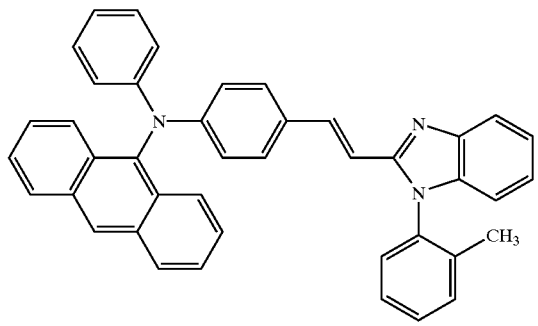
(D-42)

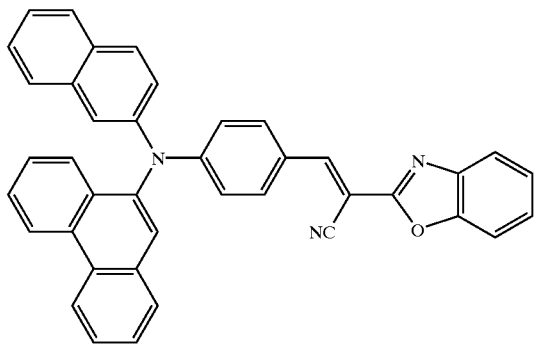
(D-43)

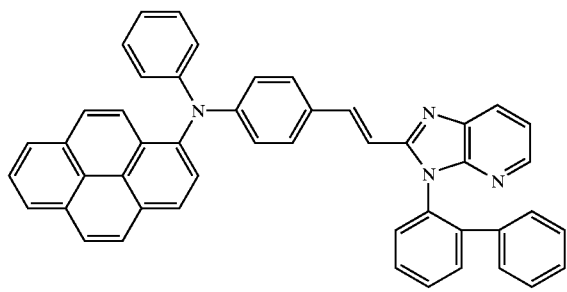
(D-44)

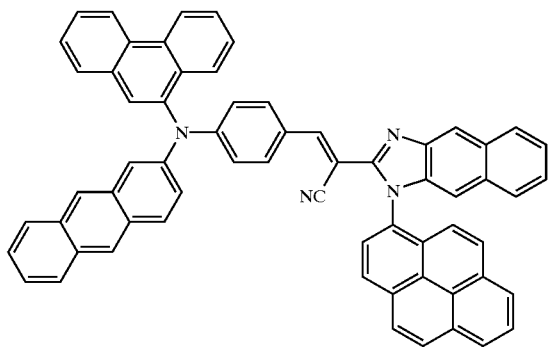
(D-45)

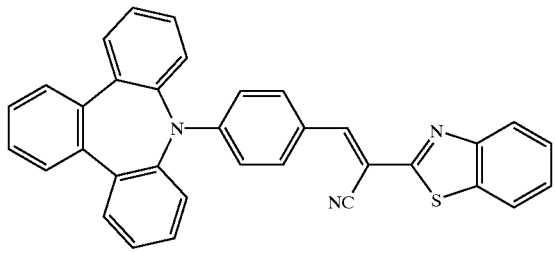
(D-46)

The compounds expressed by the general formula (A), the general formula (I), and the general formulas (III)–(IX) can be synthesized by various synthesis processes. For example, a process in which, after formylating the aryl group of the triarylamine, the aryl group of the triarylamine is reacted with an active methylene compound with or without a base present, or the like, can be applied.

The compounds expressed by the general formulas are appropriately used as light emitting element materials. Hereinafter, the light emitting element of the present invention, in which such compounds were utilized as light emitting element materials, will be explained.

An aspect of the light emitting element of the present invention is a structure comprising, between a pair of electrodes consisting of an anode and cathode formed on a substrate, at least one organic thin film layer which contains either one of or a plurality of the compounds expressed by the general formula (A), the general formula (I), the general formulas (III)–(IX).

The anode is for supplying positive holes to a positive hole injecting layer, positive hole transporting layer, or light emitting layer or the like, and as its material, a metal, alloy, metallic oxide, electroconductive compound, or mixtures thereof can be used. A material whose work function is 4eV or more is preferable. Specific examples thereof include a conductive metallic oxide such as tin oxide, zinc oxide, indium oxide, indium tin oxide (ITO) or the like; metal such as gold, silver, chromium, nickel or the like; a mixture or laminated material of such metals and a conductive metallic oxide; inorganic conductive material such as copper iodide, copper sulfide or the like; organic conductive material such as a polyaniline, polythiophene, polypyrrole or the like, and a laminated material formed by these preceding materials and ITO; and the like. A conductive metallic oxide is preferable (for the material), and particularly, in terms of productivity, high conductivity, and transparency, ITO is preferable.

Though the preferable range of film thickness of the anode differs depending on the material, it is normally from 10 nm to 5 μm, more preferably from 50 nm to 1 μm, and even more preferably from 100 nm to 500 μm.

The anode is formed by forming a layer which is made of the aforementioned material on a substrate made of a soda lime glass, non-alkali glass, clear resin or the like. In a case in which a glass is used as the substrate, it is preferable to use a non-alkali glass since the amount of eluted ions from the glass can be thereby reduced. Further, in a case in which a soda lime glass is used as the substrate, it is preferable to use a soda lime glass on which a barrier coating such as a silica has been applied. Thickness of the substrate is not particularly limited so long as the substrate is thick enough to maintain its mechanical strength; however, in a case in which a glass is used, thickness is normally 0.2 mm or more, and preferably 0.7 mm or more. For forming the anode layer on the substrate, an appropriate process may be selected in accordance with the material used for the anode layer. For example, in a case in which an ITO is used for the material of the anode, a film can be formed using an electron beam process, sputtering process, resistance heating deposition process, chemical reaction process (sol-gel process, or the like), coating process which applies a dispersion of indium tin oxide, or the like. By effecting washing or other processings for the formed anode, driving voltage of an element can be reduced, or luminous efficiency of the element can be improved. For example, for an anode made of an ITO, UV-ozone processing, plasma processing, or the like are effective.

The cathode is for supplying electrons to an electron injecting layer, electron transporting layer, light emitting layer, or the like, and the material for the cathode can be selected from any of various materials in consideration of the ability to adhere to a layer adjacent to a negative electrode of the electron injecting layer, electron transporting layer, light emitting layer and the like, the ionization potential, the stability, and the like. As material for the cathode, a metal, alloy, metallic halide, metallic oxide, electroconductive compound, or mixtures thereof can be used. Specific examples thereof include an alkali metal (for example, Li, Na, K, Cs or the like) and fluorides and oxides thereof, alkali-earth metal (for example, Mg, Ca or the like) and fluorides and oxides thereof, gold, silver, lead, aluminum, sodium-potassium alloy or a mixed metal thereof, lithium-aluminum alloy or a mixed metal thereof, magnesium-silver alloy or a mixed metal thereof, and rare earth metal such as an indium and ytterbium. The material for the cathode is, preferably a material whose work function is 4eV or less, and more preferably an aluminum, lithium-aluminum alloy or mixed metal thereof, magnesium-silver alloy or mixed metal thereof, or the like. The cathode may be a single layer structure which consists of the aforementioned compound and mixtures thereof, or a laminated layer structure which contains the aforementioned compound and mixtures thereof.

Though the preferable range of film thickness of the cathode differs depending on the material, the range is normally from 10 nm to 5 $\mu$m, more preferably from 50 nm to 1 $\mu$m, and particularly preferably from 100 nm to 1 $\mu$m. For preparation of the cathode, an electron beam process, sputtering process, resistance heating deposition process, coating process, or the like can be used, and a metal can be deposited by itself, or two or more components can be deposited at the same time. Further, it is possible to deposit a plurality of metals at the same time to form an alloy electrode. Alternatively, alloy which has been prepared in advance may be deposited. Moreover, the cathode which was made of the aforementioned material may be formed on a substrate. In this case, layer formation of the light emitting element of the present invention is formed by sequentially laminating, on the substrate, the cathode, an organic thin film layer which contains the aforementioned compound, and the anode.

It should be noted that lower sheet resistance of the aforementioned anode and cathode is preferable, and several hundreds $\Omega/\square$ or less is preferable.

The organic thin film layer at least has functions such as the following functions of a light emitting layer: a function which, at the time when an electric field is applied, allows injection of positive holes from the anode (a positive hole injection layer and/or a positive hole transport layer when such layers are provided), and allows injection of electrons from a cathode (an electron injection layer and/or an electron transport layer when such layers are provided); a function of moving injected charges; and a function which provides places for the rebonding of the positive holes and the electrons to as to allow emission of light; and the like. Further, the organic thin film layer may function as a positive hole injection layer and/or a positive hole transport layer as will be described layer, or may function as an electron injection layer and/or an electron positive hole transport layer as will be described later. The organic thin film layer may include a single compound of the compounds expressed by general formula (A), general formula (I), and general formulas (III) through (IX), or a plurality of these compounds in combination, or may include the following light emitting materials. Further, these compounds may be included in the organic thin film layer in a state of being dispersed in a polymer. Examples of the light emitting material contained in the light emitting layer include benzooxazole derivatives, benzoimidazole derivatives, benzothiazole derivatives, styrylbenzene derivatives, polyphenyl derivatives, diphenylbutadiene derivatives, tetraphenylbutadiene derivatives, naphthalimide derivatives, courmaline derivatives, perylene derivatives, perynone derivatives, oxadiazole derivatives, ardazine derivatives, pyralizine derivatives, cyclopentadiene derivatives, bis-styrylanthracene derivatives, quinacridone derivatives, pyrolopyridine derivatives, thiadiazolopyridine derivatives, cyclopentadiene derivatives, styrylamine derivatives, aromatic dimethylidine compounds, or various types of metal complexes such as metal complexes of 8-quinolinol derivatives, rare earth complexes, transition metal complexes (e.g., orthometallized complexes such as iridium (III) tris(2-phenylpyridine) complex), or polymer compounds such as polythiofene, polyphenylene, polyphenylenevinylene, or the like.

The process for forming the organic thin film layer is not particularly limited. However, a resistance heating deposition, electron beam, sputtering process, molecular lamination process, coating process (a spin-coat process, cast process, dip-coat process, or the like), LB process, ink jet process, printing process or the like may be used. In view of various characteristics of the light emitting element, readiness of manufacture, and the like, it is preferable to form the organic thin film layer by the resistance heating deposition or coating process. In a case in which the organic thin film layer is formed by the coating process, a coating solution, in which the aforementioned compound is dissolved or dispersed in a solvent, is applied onto the anode. However, in this case, the coating solution can also be prepared by dissolving or dispersing the aforementioned compound, with a resin component, in a solvent. Examples of the resin component to be used include polyvinyl chloride, polycarbonate, polystyrene, polymethylmethacrylate, polybutylmethacrylate, polyester, polysulfone, polyphenylene oxide, polybutadiene, poly (N-vinylcarbazole), hydrocarbon resin, ketone resin, phenoxy resin, polyamide, ethyl cellulose, vinyl acetate, ABS resin, polyurethane, melamine resin, unsaturated polyester resin, alkyl resin, epoxy resin, silicon resin, and the like. It should be noted that the film thickness of the organic thin film layer is not particularly limited. However, the thickness normally from 1 nm to 5 $\mu$m, preferably from 5 nm to 1 $\mu$m, and more preferably from 10 nm to 500 nm.

Preferable examples of materials contained in the light emitting layer are the compounds expressed by the aforementioned general formula (A), the general formula (I), or the general formulas (III)–general formula (IX). However, other light emitting materials described above may also be used.

A positive hole injecting layer and/or a positive hole transporting layer may be provided between the anode and organic thin film layer, or an electron injecting layer and/or an electron transporting layer may be provided between the organic thin film layer and cathode, as desired. Further, a protection layer may be formed on the cathode, and each of these layers may be a layer to which other functions are provided, respectively.

For materials for the positive hole injecting layer and the positive hole transporting layer, those which have any of a function of injecting positive holes from an anode, a function of transporting positive holes, and a function of blocking electrons injected from a cathode may be used. Specific examples thereof include a carbazole derivative, triazole derivative, oxazole derivative, oxadiazole derivative, imidazole derivative, polyarylalkane derivative, pyrazoline derivative, pyrazolone derivative, phenylenediamine derivative, arylamine derivative, amino substituted chalcone derivative, styrylanthracene derivative, fluorenone derivative, hydrazone derivative, stilbene derivative, silazane derivative, aromatic tertiary amine compound, styrylamine compound, aromatic dimethylidyne system compound, porphyrin system compound, polysilane system compound, poly (N-vinylcarbazole) derivative, aniline system copolymer, conductive high molecular oligomer such as a thiopheneoligomer, polythiophene or the like, and the like. Further, the compounds expressed by the aforementioned general formula (A), the general formula (I), or the general formulas (III)–(IX) can also be used. The positive hole injecting layer and the positive hole transporting layer may be a single layer structure which is made by one or two or more of the materials described above, or may be a multi-layered structure which is made by a plurality of layers of homogeneous compositions or heterogeneous compositions.

Though the film thickness of the positive hole injecting layer and the positive hole transporting layer is not particularly limited, the thickness is normally from 1 nm to 5 $\mu$m, preferably from 5 nm to 1 $\mu$m, and more preferably from 10 nm to 500 nm. Further, a method for forming the positive hole injecting layer and the positive hole transporting layer that is the same as the method for forming the organic thin film layer is used.

As materials for the electron injecting layer and electron transporting layer, those which have any of a function of injecting electrons from a cathode, a function of transporting electrons, and a function of blocking positive holes injected from an anode may be used. Specific examples thereof include a triazole derivative, oxazole derivative, oxadiazole derivative, fluorenone derivative, anthraquinodimethane derivative, anthrone derivative, diphenylquinone derivative, thiopyrane dioxide derivative, carbidiimide derivative, fluorenilidenemethane derivative, distyrylpyrazine derivative, heterocyclic ring tetra-carboxylic acid anhydride such as naphthaleneperylene, phthalocyanine derivative, various kinds of metallic complex exemplified by a metallic complex of 8-quinolinol derivative and a metallic complex having a metal phthalocyanine, benzoxazole, or benzothiazole which serves as a ligand, and the like. The electron injecting layer and the electron transporting layer may be a single layer structure which is formed with one, or two or more of the materials described above, or may be a multi-layered structure structured by a plurality of layers of homogeneous compositions or heterogeneous compositions.

In a case in which the organic thin film layer also functions as an electron injecting layer and/or an electron transporting layer, it is preferable to form the organic thin film layer using an electron injecting agent and electron transporting agent with the compounds expressed by the general formula (A), the general formula (I), or the general formulas (III)–(IX) (for example, by depositing materials of both the compound and the electron injecting agent and/or electron transporting agent, together).

Though the film thickness of the electron injecting layer and the electron transporting layer is not particularly limited, the thickness is normally from 1 nm to 5 $\mu$m, preferably from 5 nm to 1 $\mu$m, and more preferably from 10 nm to 500 nm. Further, a method for forming the electron injecting layer and the electron transporting layer is the same as the method for forming the organic thin film layer 16.

As materials for the protective layer, those which have a function for inhibiting moisture, oxygen, and the like, which accelerate deterioration of the element, from entering the element may be used. Specific examples thereof include: a metal such as In, Sn, Pb, Au, Cu, Ag, Al, Ti, and Ni; metallic oxide such as MgO, SiO, $SiO_2$, $Al_2O_3$, GeO, NiO, CaO, BaO, $Fe_2O_3$, $Y_2O_3$, and $TiO_2$; metallic fluoride such as $MgF_2$, LiF, $AlF_3$, and $CaF_2$; polyethylene; polypropylene; polymethylmethacrylate; polyimide; polyurea; polytetrafluoroethylene; polychloro-trifluoroethylene; poly dichloro-di-fluoroethylene; copolymer of a chlorotrifluoroethylene and dichloro-di-fluoroethylene; copolymer obtained by copolymerizing a tetrafluoroethylene and monomer mixture which contains at least one kind of comonomer; fluorine containing copolymer having a copolymerized principal chain in a form of annular structure; water-absorbing material having water-absorptivity of 1 percent or more; moisture-proof material having water-absorptivity of 0.1 percent or less, and the like.

There is no particular limitation on a method for forming the protective layer as well and examples of applicable forming methods thereof include a vacuum deposition process, sputtering process, reactive sputtering process, MBE (molecular beam epitaxy) process, cluster ion beam process, ion plating process, plasma copolymerization process (high-frequency excitation ion plating process), plasma CVD process, laser CVD process, heat CVD process, gas source CVD process, coating process, printing process, and ink jet process.

By applying, between the anode and the cathode, a direct voltage (normally, a pulse voltage ranging from 2 volts to 30 volts; an alternating current may be included as needed) or a pulse current, the light emitting element of the present invention can be made to emit light. In terms of driving the light emitting element of the present invention, methods described in Japanese Patent Application Laid-Open (JP-A) No. 2-148687, No. 6-301355, No. 5-29080, No. 7-134558, No. 8-234685, No. 8-241047, or the like can be utilized.

Though more details of the present invention will be explained while referring to examples hereinafter, the present invention is not limited in any way to the following examples.

SYNTHESIS EXAMPLE-1

Synthesis of Illustrated Compound (D-7)

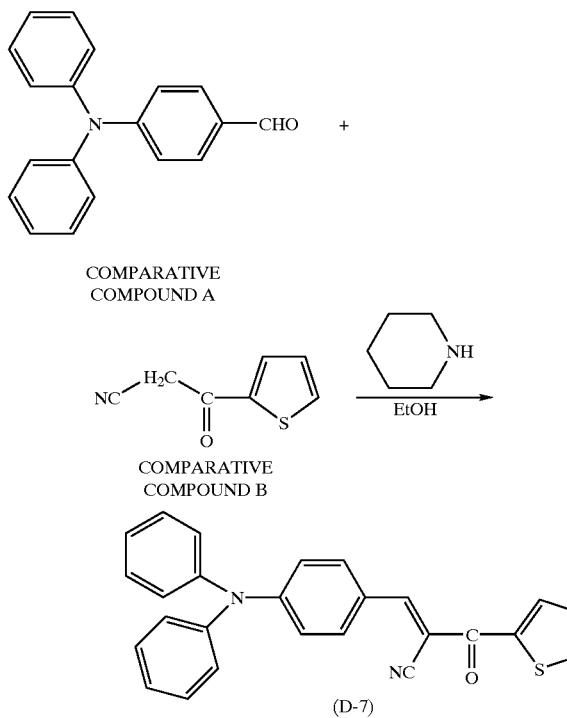

2.7 g of intermediate A and 1.5 g of intermediate B are dissolved in 50 ml of ethanol, and to this solution was further added 0.85 g of peperidine, and the mixture was heated under reflux for 6 hours. The reaction solution was cooled at room temperature and the precipitated crystal was filtered out. The resulting crude crystal was purified by silica gel chromatography and crystallized with an ethanol-chloroform solvent to obtain an intended example compound (D-7) (mp 169 to 171° C.)

SYNTHESIS EXAMPLE-2

An example compound (D-8) which was intended was synthesized by the same method as that of the Synthesis Example-1 (mp 199 to 200° C.).

SYNTHESIS EXAMPLE-3

An example compound (D-13) which was intended was synthesized by the same method as that of the Synthesis example-1 (mp 212 to 214° C.).

SYNTHESIS EXAMPLE-4

An example compound (D-14) which was intended was synthesized by the same method as that of the Synthesis Example-1 (mp 162 to 164° C.).

SYNTHESIS EXAMPLE-5

An example compound (D-15) which was intended was synthesized by the same method as that of the Synthesis example-1 (mp 176 to 178° C.).

SYNTHESIS EXAMPLE-6

An example compound (D-27) which was, intended was synthesized by the same method as that of the Synthesis example-1(mp 257 to 262° C.).

EXAMPLE 1

A glass substrate having dimensions of 25 mm×25 mm×0.7 mm, on which ITO was coated at a thickness of 150 nm (manufactured by Tokyo Sanyo Sinku Corporation), was used as a transparent supporting substrate. After etching and washing the glass substrate, about 40 nm of TPD (N,N'-bis (3-methylphenyl)-N,N'-diphenylbenzidine), about 40 nm of the compound recited in Table 1, and about 20 nm of Alq (tris(8-hydroxyquinolinato)aluminum) were sequentially deposited together onto the glass substrate in a vacuum of $1.0 \times 10^{-3}$ to $1.3 \times 10^{-4}$ Pa under a condition that the substrate's temperature was room temperature, and a mask onto which patterning had been applied (a mask whose light emitting area was 5 mm×5 mm) was set on the layer of Alq. After depositing 50 nm of magnesium and silver together at a ratio of 10 to 1 (magnesium: silver=10:1) within a deposition device, 50 nm of silver was deposited to prepare a light emitting element ("EL element").

Using Source Measure Unit Type 2400 manufactured by Toyo Technica, a direct current regulated voltage was applied to the EL element to cause the EL element to emit light, and luminance was measured using a Luminancemeter BM-8 of Thopcon Co. The emission spectrum was measured using a Spectrum Analyzer PMA-11 manufactured by Hamamatsu Photonics Co. to determine the chromaticity coordinate. If the luminous wavelength was from 580 to 670 nm, and the chromaticity coordinate has $0.60 \leq x \leq 0.75$, $0.20 \leq y \leq 0.40$, the EL element had an excellent red light emission characteristic. Evaluation results are presented in Table 1. Further, evaluation criteria for dark spots in Table 1 are as follows.

TABLE 1

| Element No. | Compound | Maximum Luminescence (cd/m$^2$) | Driving Voltage (V) | Luminous Wavelength λ max (nm) | CIE Chromaticity Coordinate (x, y) | Dark Spots |
|---|---|---|---|---|---|---|
| 101 | Comparative Compound A | 500 | 12 | 546 | (0.45, 0.51) | X |
| 102 | Comparative Compound B | 800 | 12 | 612 | (0.57, 0.41) | Δ |
| 103 | D-8 | 1520 | 14 | 633 | (0.60, 0.38) | ○ |
| 104 | D-15 | 1250 | 13 | 641 | (0.63, 0.36) | ○ |
| 105 | D-27 | 1340 | 14 | 625 | (0.60, 0.39) | ○ |

TABLE 1-continued

| Element No. | Compound | Maximum Luminescence (cd/m²) | Driving Voltage (V) | Luminous Wavelength λ max (nm) | CIE Chromaticity Coordinate (x, y) | Dark Spots |
|---|---|---|---|---|---|---|

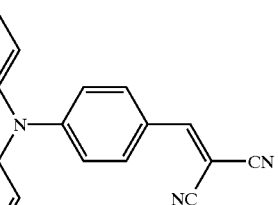

INTERMEDIATE A

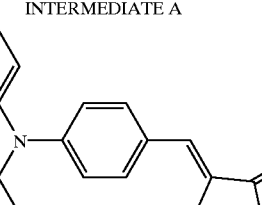

INTERMEDIATE B

○: Dark spots cannot be identified by the naked eye
Δ: Small number of dark spots
X: Large number of dark spots From the results of Table 1, it was verified that, if the light emitting element material of the present invention was used separately as a light emitting material for a light emitting layer, the light emitting material can have a satisfactory color purity and was capable of high luminance light emission. Moreover, it was verified that the EL element containing the light emitting element material of the present invention was excellent in a sheet form. Further, it was also verified that, even after the long period of light emission, the EL element containing the light emitting element material of the present invention had a small number of dark spots and excellent durability.

EXAMPLE 2

After etching and washing an ITO substrate, about 40 nm of TPD was deposited onto the ITO substrate, as in Example 1. After that, compounds recited in Table 2 and Alq (tris(8-hydroxyquinolinato)aluminum) were deposited together onto the ITO substrate at each deposition velocity of 0.004 nm/second and 0.4 nm/second, to form a film thickness of approximately 40 nm. Moreover, 20 nm of Alq was separately deposited onto the ITO substrate. Sequentially, a cathode was deposited onto the ITO substrate as in Example 1 to prepare an EL element, and the EL element was evaluated as in Example 1.

The evaluation results are presented in Table 2. It should be noted that, in Table 2, the evaluation criteria for dark spots is the same as that for Table 1.

TABLE 2

| Element No. | Compound | Maximum Luminescence (cd/m²) | Driving Voltage (V) | Luminous Wavelength λ max (nm) | CIE Chromaticity Coordinate (x, y) | Dark Spots |
|---|---|---|---|---|---|---|
| 201 | Comparative Compound A | 600 | 16 | 600 | (0.53, 0.46) | Δ |
| 202 | Comparative Compound B | 830 | 16 | 605 | (0.53, 0.44) | Δ |
| 203 | D-8 | 1310 | 16 | 632 | (0.60, 0.38) | ○ |
| 204 | D-15 | 1170 | 16 | 635 | (0.61, 0.37) | ○ |
| 205 | D-27 | 1270 | 16 | 620 | (0.60, 0.40) | ○ |

From the results of Table 2, it was verified that, if the light emitting element material of the present invention was used as a dope dye, a light emitting material which was capable of high luminance light emission can be obtained. Moreover, it was verified that the EL element containing the compound of the present invention was excellent in a sheet form. Further, it was verified that, even after a long period of light emission, the EL element containing the compound of the present invention had a small number of dark spots as well as excellent durability.

EXAMPLE 3

After etching and washing an ITO substrate, 40 mg of poly (N-vinylcarbazole), 12 mg of PBD (2-(4-biphenyl)-5-

(4-tert-butylphenyl)-1, 3, 4-oxadiazole), and 0.5 mg of the compound recited in Table 1 were dissolved in 3 ml of 1,2-dichloroethane, and the washed ITO substrate was spin-coated with the solution. Thickness of the generated organic thim film was about 120 nm. Next, a cathode was deposited onto the ITO substrate as in Example 1 to prepare an EL element, and the EL element was evaluated as in Example 1.

The evaluation results are presented in Table 3.

TABLE 3

| Element No. | Compound | Maximum Luminescence (cd/m$^2$) | Driving Voltage (V) | Luminous Wavelength λ max (nm) | CIE Chromaticity Coordinate (x, y) |
|---|---|---|---|---|---|
| 301 | Comparative Compound A | 300 | 16 | 580 | (0.51, 0.48) |
| 302 | Comparative Compound B | 350 | 16 | 612 | (0.55, 0.43) |
| 303 | D-8 | 650 | 16 | 635 | (0.61, 0.37) |
| 304 | D-15 | 610 | 17 | 642 | (0.63, 0.35) |
| 305 | D-27 | 625 | 17 | 625 | (0.60, 0.38) |

From the results of Table 3, it was verified that, if the light emitting element material of the present invention was used, even in a case in which a light emitting layer was formed with a coating method which would normally lead to low light emission luminance, low voltage drive and high luminance light emission were more possible than in a case in which a comparative compound was used.

EXAMPLE 4

After etching and washing an ITO substrate as in Example 1, about 60 nm of the example compound D-15 was deposited onto the ITO substrate. After that, about 40 nm of Alq was deposited, and subsequently, a cathode was deposited onto the ITO cathode as in Example 1 to prepare an EL element.

As a result of evaluating the prepared EL element as in Example 1, luminance of 530 cd/m$^2$ was demonstrated with application of 15 V. Also, red light emission with high color purity of λ max=643 nm, CIE chromaticity (x, y)=(0.63, 0.34) was observed, and it was verified that the light emitting element material of the present invention was effective as a positive hole injecting transporting agent and a red light emission agent.

EXAMPLE 5

Onto an ITO glass substrate for which etching and washing had been effected as in Example 1, about 40 nm of NPD (N,N'-bis (1-naphthyl)-N,N'-diphenylbenzidine), about 20 nm of the example compound D-2, about 10 nm of bathocuproin, and about 30 nm of Alq (tris(8-hydroxyquinolinato)aluminum) were deposited. Subsequently, a cathode was deposited as in Example 1 to prepare an EL element.

As a result of evaluating the prepared EL element as in Example 1, luminance of 1380 cd/m$^2$ was demonstrated with application of 14 V. Also, red light emission with high color purity of λ max=645 nm, CIE chromaticity (x, y)= (0.65, 0.34) was observed, and it was verified that the light emitting element material of the present invention was effective as a red light emission agent.

EXAMPLE 6

Onto an ITO glass substrate for which etching and washing had been effected as in Example 1, a solution was spin-coated. The solution contained 40 mg of poly (N-vinylcarbazole), 12 mg of 2,5-bis (1-naphthyl)-1,3,4-oxadiazole), 10 mg of 1,1,4,4-tetraphenylbutadiene, 0.5 mg of DCM, and 0.1 mg of the example compound D-1 of the present invention dissolved in 3 ml of 1,2-dichloroethane. Next, a cathode was deposited as in Example 1 to prepare an EL element.

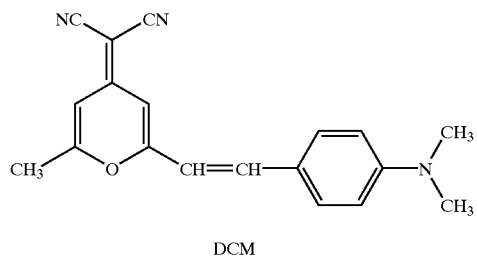

DCM

Direct current was applied to the prepared EL element using an ITO electrode as an anode and Mg: Ag electrode as a cathode, and light emission characteristic of the EL element was monitored. As a result, white color light emission (luminance of 1050 cd/m$^2$) of (x, y)=(0.35, 0.34) on a CIE chromaticity diagram was obtained with application of 15 V. It was verified that the light emitting element material of the present invention is effective as a material for white color light emission.

The light emitting element material and the amine compound of the present invention is useful as a light emission agent, positive hole injecting agent, and positive hole transporting agent. In comparison with conventional EL elements, the El element containing the compound of the present invention demonstrates light emission characteristics of high luminance and high color purity, and in particular, while demonstrating light emission characteristics of red light emission with high color purity, is significantly superior in a sheet form and in terms of durability. Even as a non-doping type EL element, the high performance EL element containing the compound of the present invention can be manufactured at low cost and in a stable manner, since there is little deviation in performance among the elements. Further, in comparison with EL elements manufactured using a conventional application system, light emission characteristics are demonstrated in which luminance of emitted light is significantly superior.

What is claimed is:

1. A light emitting element material comprising a compound expressed by following general formula (A):

General formula (A)

wherein, in the general formula (A), R$^1$, R$^2$, and R$^3$ may be the same or different, may each have a substituent, and each independently represent an aryl group, heterocyclic group, or aliphatic hydrocarbon group; at least two of the R$^1$, R$^2$, and R$^3$ each independently represents an aryl group or heterocyclic group each of which may have a substituent; at least one of the R$^1$, R$^2$, and R$^3$ contains a group expressed by following general formula (B); and R$^1$, R$^2$, and R$^3$ may link with each other to form a ring having 5 to 7 members, General formula (B)

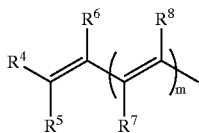

wherein, in the general formula (B), $R^4$ represents a heterocyclic group or electron attracting group; $R^5$ represents an electron attracting group; $R^6$, $R^7$, and $R^8$ each independently represents a hydrogen atom or substituent; $R^6$, $R^7$, and $R^8$ may combine with each other to form a ring, or may combine with $R^1$, $R^2$, and $R^3$, respectively, to form a ring; m represents 0, 1, or 2; and when only one group expressed by the general formula (B) is contained in the general formula (A), a case where $R^4$ and $R^5$ are both cyano groups at the same time is excluded.

2. A light emitting element material according to claim 1, wherein the compound expressed by the general formula (A) is a compound expressed by following general formula (I):

General formula (I)

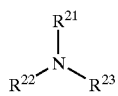

wherein, in general formula (I), $R^{21}$, $R^{22}$, and $R^{23}$ may be the same or different, may each have a substituent, and each independently represents an aryl group, heterocyclic group, or aliphatic hydrocarbon group; at least two of the $R^{21}$, $R^{22}$, and $R^{23}$ each independently represents an aryl group or heterocyclic group each of which may have a substituent; and, at least one of the $R^{21}$, $R^{22}$, and $R^{23}$ contains a group expressed by following general formula (II):

General formula (II)

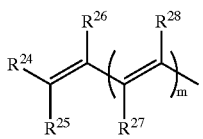

wherein, in the general formula (II), $R^{24}$ represents a heterocyclic group, cyano group, perfluoroalkyl group, oxycarbonyl group, carbamoyl group, sulfonyl group, sulfamoyl group, or R(C=X)-group; $R^{25}$ represents a cyano group, perfluoroalkyl group, oxycarbonyl group, carbamoyl group, sulfonyl group, sulfamoyl group, or R(C=X)-group; R represents an aliphatic hydrocarbon group, aryl group, or heterocyclic group; X represents an oxygen atom, sulfur atom, N—$R^{A1}$, or $CR^{A2}R^{A3}$; $R^{A1}$, $R^{A2}$, and $R^{A3}$ each independently represents a hydrogen atom or substituent, excluding a case where $R^{A2}$ and $R^{A3}$ are both hydrogen atoms; $R^{26}$, $R^{27}$, and $R^{28}$ each independently represents a hydrogen atom or substituent; m represents 0, 1, or 2; and when only one group expressed by the general formula (II) is contained in the general formula (I), a case where $R^{24}$ and $R^{25}$ are cyano groups at the same time is excluded.

3. A light emitting element material according to claim 2, wherein the compound expressed by the general formula (I) is a compound expressed by following general formula (III):

General formula (III)

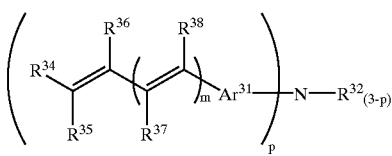

wherein, in the general formula (III), $Ar^{31}$ represents a divalent aryl group or heterocyclic group; $R^{32}$ represents an aryl group, heterocyclic group, or aliphatic hydrocarbon group; $R^{34}$ represents a heterocyclic group, perfluoroalkyl group, cyano group, oxycarbonyl group, carbamoyl group, sulfonyl group, sulfamoyl group, or R(C=X)-group; $R^{35}$ represents a perfluoroalkyl group, cyano group, oxycarbonyl group, carbamoyl group, sulfonyl group, sulfamoyl group, or R(C=X)-group; R represents an aliphatic hydrocarbon group, aryl group, or heterocyclic group; X represents an oxygen atom, sulfur atom, N—$R^{A1}$, or $CR^{A2}R^{A3}$; $R^{A1}$, $R^{A2}$, and $R^{A3}$ each independently represents a hydrogen atom or substituent, excluding a case in which $R^{A2}$ and $R^{A3}$ are both hydrogen atoms; $R^{36}$, $R^{37}$, and $R^{38}$ each independently represents a hydrogen, atom or a substituent; m represents 0, 1, or 2; p represents 1, 2, or 3; and when p is 2 or 3, two or more combinations of $Ar^{31}$, $R^{34}$, $R^{35}$, $R^{36}$, $R^{37}$, $R^{38}$ and m may be the same or different, and when p is 1, two $R^{32}$s may be the same or different, at least one of the two $R^{32}$s represents an aryl group or heterocyclic group and a case in which $R^{34}$ and $R^{35}$ are cyano groups at the same time is excluded.

4. A light emitting element material according to claim 3, wherein the compound expressed by the general formula (III) is a compound expressed by following general formula (V):

General formula (V)

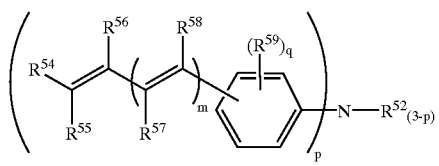

wherein, in the general formula (V), $R^{52}$ represents an aryl group, heterocyclic group or aliphatic hydrocarbon group; $R^{54}$ represents a heterocyclic group, perfluoroalkyl group, cyano group, oxycarbonyl group, carbamoyl group, sulfonyl group, sulfamoyl group, or R(C=X)-group; $R^{55}$ represents a perfluoroalkyl group, cyano group, oxycarbonyl group, carbamoyl group, sulfonyl group, sulfamoyl group, or R(C=X)-group; R represents an aliphatic hydrocarbon group, aryl group, or heterocyclic group; X represents an oxygen atom, sulfur atom, N—$R^{A1}$, or $CR^{A2}R^{A3}$; $R^{A1}$, $R^{A2}$ and $R^{A3}$ each independently represents a hydrogen atom or substituent, excluding a case in which $R^{A2}$ and $R^{A3}$ are both hydrogen atoms; $R^{56}$, $R^{57}$, and $R^{58}$ each independently represents a hydrogen atom or substituent; $R^{59}$ represents a substituent; q represents an integer from 0 to 4; when q is 2, 3, or 4, two or more $R^{59}$s may be the same or different; m represents 0, 1, or 2; p represents 1, 2, or 3; when p is 2 or 3, two or more combinations of $R^{52}$, $R^{54}$, $R^{55}$, $R^{56}$, $R^{57}$, $R^{58}$, $R^{59}$, m, and q may be the same or different, and when p is 1, at least one of the two $R^{52}$s represents an aryl group or heterocyclic group and a case where $R^{54}$ and $R^{55}$ are both cyano groups is excluded.

5. A light emitting element material according to claim 4, wherein the compound expressed by the general formula (V) is a compound expressed by following general formula (VII):

General formula (VII)

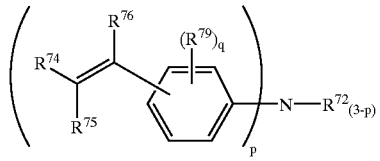

wherein, in the general formula (VII), $R^{72}$ represents an aryl group, heterocyclic group, or aliphatic hydrocarbon group; $R^{74}$ represents a heterocyclic group, perfluoroalkyl group, cyano group, oxycarbonyl group, carbamoyl group, sulfonyl group, sulfamoyl group, or R(C=X)-group; $R^{75}$ represents a perfluoroalkyl group, cyano group, oxycarbonyl group, carbamoyl group, sulfonyl group, sulfamoyl group, or R(C=X)-group; R represents an aliphatic hydrocarbon group, aryl group, or heterocyclic group; X represents an oxygen atom, sulfur atom, N—$R^{A1}$, or $CR^{A2}R^{A3}$; $R^{A1}$, $R^{A2}$ and $R^{A3}$ each independently represents a hydrogen atom or a substituent, excluding a case in which $R^{A2}$ and $R^{A3}$ are both hydrogen atoms; $R^{76}$ represents a hydrogen atom or substituent; $R^{79}$ represents a substituent; q represents an integer which is of from 0 to 4; when q is 2, 3, or 4, two or more $R^{79}$s may be the same or different; p represents 1, 2, or 3; and when p is 2 or 3, two or more combinations of $R^{72}$, $R^{74}$, $R^{75}$, $R^{76}$, $R^{79}$, and q may be the same or may be different, and when p is 1, two $R^{72}$s may be the same or different, and at least one of the two $R^{72}$s represents an aryl group or heterocyclic group, excluding a case in which $R^{74}$ and $R^{75}$ are cyano groups at the same time.

6. A light emitting element comprising a pair of electrodes and one or more organic thin film layers provided between the pair of electrodes, wherein at least one organic thin film layer contains at least one light emitting element material according to any one of claims 1, 2, 3, 4 and 5.

7. A light emitting element according to claim 6, wherein the light emitting element material is dispersed in a polymer.

* * * * *